US011201999B2

(12) United States Patent
Aoki

(10) Patent No.: US 11,201,999 B2
(45) **Date of Patent: *Dec. 14, 2021**

(54) IMAGING DEVICE, INFORMATION ACQUISITION METHOD, AND INFORMATION ACQUISITION PROGRAM

(71) Applicant: FUJIFILM Corporation, Tokyo (JP)

(72) Inventor: Takashi Aoki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/832,354

(22) Filed: Mar. 27, 2020

(65) Prior Publication Data

US 2020/0228723 A1 Jul. 16, 2020

Related U.S. Application Data

(63) Continuation of application No. PCT/JP2018/035259, filed on Sep. 25, 2018.

(30) Foreign Application Priority Data

Sep. 28, 2017 (JP) ............................ JP2017-188868

(51) Int. Cl.
*H04N 5/232* (2006.01)
*H04N 5/225* (2006.01)
*G03B 17/14* (2021.01)

(52) U.S. Cl.
CPC ....... *H04N 5/232122* (2018.08); *G03B 17/14* (2013.01); *H04N 5/2254* (2013.01);
(Continued)

(58) Field of Classification Search
CPC ....... H04N 5/232122; H04N 5/232123; H04N 5/2254; H04N 5/23209; H04N 5/23245;
(Continued)

(56) References Cited

U.S. PATENT DOCUMENTS 9,386,216 B2 7/2016 Inoue
10,791,260 B2 * 9/2020 Aoki .................... H04N 5/2253
(Continued)

FOREIGN PATENT DOCUMENTS

JP 2001-147477 A 5/2001
JP 2005-351825 A 12/2005
(Continued)

OTHER PUBLICATIONS

International Preliminary Report on Patentability (Form PCT/IPEA/409) for International Application No. PCT/JP2018/035259, dated Aug. 6, 2019, with English translation.
(Continued)

*Primary Examiner* — Abdelaaziz Tissire
(74) *Attorney, Agent, or Firm* — Birch, Stewart, Kolasch & Birch, LLP

(57) ABSTRACT

There are provided an imaging device, an information acquisition method, and an information acquisition program that can simply and accurately acquire information related to a ray angle with respect to an image sensor in a case where subject light is incident on the image sensor through an interchangeable lens even though the interchangeable lens having no compatibility is mounted on the imaging device. Under focusing on the fact that a ratio between the outputs of a first phase difference pixel (PA) and a G pixel serving as a normal pixel, which are provided on an image sensor and have different incidence angle characteristics, and information related to a ray angle with respect to the image sensor, which is obtained in a case where subject light is incident on the image sensor through an interchangeable lens, have a correspondence relationship, the ratio between the outputs of the first phase difference pixel (PA) and the G pixel is calculated and an F-Number is acquired on the basis of the calculated ratio.

17 Claims, 16 Drawing Sheets

(52) U.S. Cl.
CPC ..... *H04N 5/23209* (2013.01); *H04N 5/23245* (2013.01); *H04N 5/232123* (2018.08)

(58) Field of Classification Search
CPC ...... H04N 5/2354; H04N 5/243; H04N 5/232; H04N 9/04551; H04N 5/36961; G03B 17/14; G03B 13/36; H01L 27/14607; G02B 7/34
See application file for complete search history.

(56) References Cited

U.S. PATENT DOCUMENTS

| | | | |
|---|---|---|---|
| 2006/0257413 | A1 | 11/2006 | Zlotnick et al. |
| 2009/0163693 | A1 | 6/2009 | Onuki et al. |
| 2010/0302433 | A1 | 12/2010 | Egawa |
| 2011/0058070 | A1 | 3/2011 | Awazu |
| 2012/0257882 | A1 | 10/2012 | Kikuchi |
| 2013/0235253 | A1 | 9/2013 | Onuki et al. |
| 2014/0211076 | A1* | 7/2014 | Inoue ............... H04N 5/232122 348/349 |
| 2014/0267865 | A1 | 9/2014 | Kishi |
| 2015/0195446 | A1 | 7/2015 | Saito et al. |
| 2015/0304547 | A1 | 10/2015 | Inoue |
| 2016/0014327 | A1 | 1/2016 | Iwasaki |
| 2016/0088245 | A1* | 3/2016 | Nakata ............... H04N 5/23212 250/201.2 |
| 2016/0182794 | A1 | 6/2016 | Aoki et al. |
| 2016/0191824 | A1 | 6/2016 | Izawa et al. |
| 2016/0198105 | A1 | 7/2016 | Kawai et al. |
| 2017/0004603 | A1* | 1/2017 | Irie .................... H04N 5/23229 |
| 2017/0374270 | A1* | 12/2017 | Okubo ................. H04N 5/3572 |
| 2019/0068869 | A1 | 2/2019 | Kadambala et al. |

FOREIGN PATENT DOCUMENTS

| | | | |
|---|---|---|---|
| JP | 2008-251033 | A | 9/2008 |
| JP | 2008-259055 | A | 9/2008 |
| JP | 2012-222602 | A | 11/2012 |
| JP | 2015-129846 | A | 7/2015 |
| JP | 2016-143951 | A | 8/2016 |
| JP | 2016-145958 | A | 8/2016 |
| WO | WO 2014/141561 | A1 | 9/2014 |
| WO | WO 2015/045829 | A1 | 4/2015 |

OTHER PUBLICATIONS

International Search Report (Form PCT/ISA/210) for International Application No. PCT/JP2018/035259, dated Dec. 25, 2018, with English translation.
Written Opinion of the International Searching Authority (Form PCT/ISA/237) for International Application No. PCT/JP2018/035259, dated Dec. 25, 2018.
International Search Report (form PCT/ISA/210), dated Dec. 25, 2018, for International Application No. PCT/JP2018/035258, with an English translation.
U.S. Notice of Allowance, dated May 22, 2020, for U.S. Appl. No. 16/832,075.
Written Opinion of the International Searching Authority (form PCT/ISA/237), dated Dec. 25, 2018, for International Application No. PCT/JP2018/035258, with an English translation.

* cited by examiner

10

IMAGING DEVICE, INFORMATION ACQUISITION METHOD, AND INFORMATION ACQUISITION PROGRAM

CROSS-REFERENCE TO RELATED APPLICATIONS

The present application is a Continuation of PCT International Application No. PCT/JP2018/035259 filed on Sep. 25, 2018 claiming priority under 35 U.S.C § 119(a) to Japanese Patent Application No. 2017-188868 filed on Sep. 28, 2017. Each of the above applications is hereby expressly incorporated by reference, in its entirety, into the present application.

BACKGROUND OF THE INVENTION

1. Field of the Invention

The present invention relates to an imaging device, an information acquisition method, and an information acquisition program, and more particularly, to a technique that acquires information about an interchangeable lens mounted on an imaging device.

2. Description of the Related Art

Roughly two types of interchangeable lenses can be mounted on an imaging device (camera) using an interchangeable lens.

One interchangeable lens is an interchangeable lens that is manufactured according to the communication standards of a camera body and can communicate with the camera body. In a case where this kind of interchangeable lens is mounted on the camera body, the camera body can communicate with the mounted interchangeable lens and can completely acquire lens information about the interchangeable lens (for example, the stop value (F-Number) of a stop provided in the interchangeable lens, the position of a focus lens, the focal length of the interchangeable lens, and the like).

The other interchangeable lens is an interchangeable lens (an interchangeable lens having no compatibility) that is not manufactured according to the communication standards of a camera body and cannot completely communicate with the camera body, and corresponds to a third-party interchangeable lens or an old lens. A lens, which of which communication protocol and the like are different from those of the camera body and partial lens information can be acquired by the camera body but at least an F-Number cannot be acquired, corresponds to the other interchangeable lens having no compatibility in this example.

An imaging device disclosed in WO2015/045829A comprises an image sensor of which one pixel is divided into a plurality of areas and which includes an on-chip microlens causing a pupil image of an imaging optical system to be formed in a plurality of areas and reading units reading photoelectrically converted signals and provided in the plurality of divided areas. In a case where information about a stop value cannot be acquired from an interchangeable lens, the imaging device detects the current stop value of the interchangeable lens on the basis of the signals of the plurality of divided areas.

That is, since subject light is incident on only the divided areas corresponding to the stop value of the interchangeable lens among the plurality of divided areas forming one pixel of the image sensor, the current stop value of the interchangeable lens can be detected using the signals of the plurality of divided areas.

Further, JP2001-147477A discloses a camera of which an imaging lens is interchangeable and which obtains a stop value set in the imaging lens on the basis of a difference between a through-the-lens (TTL) photometric value that is obtained from the photometry of light passing through the imaging lens and an external light-photometric value that is obtained from the direct photometry of external light. That is, tables where a stop value is determined depending on a difference between a TTL photometric value and an external light-photometric value are prepared according to the type of imaging lenses, and a table is selected through the input of the type of the imaging lens. Then, a stop value corresponding to a difference between a TTL photometric value and an external light-photometric value is read from the selected table.

Furthermore, JP2016-145958A discloses a technique for estimating the stop value of a lens barrel from a change in a contrast value depending on the position of an image sensor in the direction of an optical axis.

That is, a table where a contrast shape corresponding to a stop value (a change in a contrast value with respect to a change in the position of the image sensor in the direction of the optical axis) is predetermined is provided, and a contrast detection section determines a contrast shape and reads a stop value having a corresponding contrast shape from the table on the basis of the determined contrast shape.

SUMMARY OF THE INVENTION

A special image sensor needs to be provided in the invention disclosed in WO2015/045829A to estimate a stop value. That is, the image sensor, of which one pixel is divided into a plurality of areas and which includes an on-chip microlens causing a pupil image of an imaging optical system to be formed in a plurality of areas and reading units reading photoelectrically converted signals and provided in the plurality of divided areas, needs to be provided in the invention disclosed in WO2015/045829A.

Further, a through-the-lens (TTL) photometric value and an external light-photometric value need to be acquired and a table, which is used to determine a stop value depending on a difference between a TTL photometric value and an external light-photometric value, needs to be prepared for each type of an imaging lens in the invention disclosed in JP2001-147477A. Accordingly, the invention disclosed in JP2001-147477A cannot be applied to an unknown interchangeable lens for which a table is not clear.

In the invention disclosed in JP2016-145958A, the stop value of a lens barrel is estimated from a change in a contrast value depending on the position of an image sensor in the direction of an optical axis. However, the contrast (the level of contrast) of a subject to be imaged in a case where a stop value is to be estimated affects a change in a contrast value depending on the position of the image sensor in the direction of an optical axis. For this reason, there is a problem that a stop value cannot be correctly estimated form a contrast shape.

The invention has been made in consideration of the above-mentioned circumstances, and an object of the invention is to provide an imaging device, an information acquisition method, and an information acquisition program that can simply and accurately acquire information related to a ray angle with respect to an image sensor in a case where subject light is incident on the image sensor through an interchangeable lens even though the interchangeable lens having no compatibility is mounted on the imaging device.

To achieve the object, an imaging device according to an aspect of the invention comprises: an image sensor that includes a first pixel and a second pixel having incidence angle characteristics different from incidence angle characteristics of the first pixel; a mount part to and from an interchangeable lens is attachable and detachable; a pixel information acquisition section that acquires an output of the first pixel of the image sensor, on which subject light is incident through the interchangeable lens mounted on the mount part, and an output of the second pixel; an arithmetic operator (arithmetic operation section) that calculates a ratio between the output of the first pixel and the output of the second pixel acquired by the pixel information acquisition section; and an information acquisition section that acquires information related to a ray angle with respect to the image sensor in a case where the subject light is incident on the image sensor through the interchangeable lens on the basis of the ratio calculated by the arithmetic operator.

According to the aspect of the invention, under focusing on the fact that a ratio between the outputs of a first pixel and a second pixel, which are provided on an image sensor and have different incidence angle characteristics, and information related to a ray angle with respect to the image sensor, which is obtained in a case where subject light is incident on the image sensor through an interchangeable lens, have a correspondence relationship, the ratio between the outputs of the first pixel and the second pixel is calculated and the information related to a ray angle with respect to the image sensor is acquired on the basis of the calculated ratio.

In the imaging device according to the aspect of the invention, it is preferable that the image sensor includes a first phase difference pixel and a second phase difference pixel that selectively receive pieces of the subject light passing through different areas of the interchangeable lens by pupil division, the first pixel is the first phase difference pixel, and the second pixel is the second phase difference pixel. An image sensor for image plane phase-difference autofocus (AF) includes first phase difference pixels and second phase difference pixels, and an existing image sensor can be applied as the image sensor for image plane phase-difference autofocus (AF).

In the imaging device according to the aspect of the invention, it is preferable that the image sensor includes a first phase difference pixel and a second phase difference pixel that selectively receive pieces of the subject light passing through different areas of the interchangeable lens by pupil division and normal pixels that receive the pieces of the subject light, respectively, the first pixel is the first phase difference pixel or the second phase difference pixel, and the second pixel is the normal pixel.

In a case where the incidence angle characteristics of the first phase difference pixel are completely symmetric with those of the second phase difference pixel, a ratio between the outputs of the first and second phase difference pixels is not changed even though a ray angle with respect to the image sensor is changed. However, since the incidence angle characteristics of the first phase difference pixel or the second phase difference pixel are not symmetric with those of the normal pixel, a ratio between the outputs of the first or second phase difference pixel and the normal pixel is changed in a case where a ray angle with respect to the image sensor is changed. Accordingly, it is preferable that a ratio between the outputs of the first or second phase difference pixel and the normal pixel is obtained.

In the imaging device according to the aspect of the invention, it is preferable that the information related to a ray angle with respect to the image sensor is a stop value of the interchangeable lens, a numerical aperture of the interchangeable lens, or a ray angle with respect to the image sensor. The stop value, the numerical aperture, and the ray angle are related to each other. Accordingly, in a case where information about any one of them is obtained, information about the others can be calculated (converted) from the information.

In the imaging device according to the aspect of the invention, it is preferable that the information related to a ray angle with respect to the image sensor is a stop value of the interchangeable lens or a numerical aperture of the interchangeable lens, the imaging device comprises a storager in which the ratio between the output of the first pixel and the output of the second pixel is stored for each stop value of the interchangeable lens or each numerical aperture of the interchangeable lens, and the information acquisition section reads a stop value or a numerical aperture corresponding to the ratio from the storager on the basis of the ratio calculated by the arithmetic operator and acquires the read stop value or the read numerical aperture as the current stop value or the current numerical aperture of the interchangeable lens.

In a case where the ratio calculated by the arithmetic operator is not stored in the storager, a stop value or a numerical aperture corresponding to a ratio, which is closest to the ratio calculated by the arithmetic operator among the ratios stored in the storager, is read and may be used as the current stop value or the current numerical aperture of the interchangeable lens or a corresponding stop value or a corresponding numerical aperture is interpolated on the basis of the ratio calculated by the arithmetic operator and two ratios, which are stored in the storager in the front and rear (in the front and rear of the calculated ratio), and may be used as the current stop value or the current numerical aperture of the interchangeable lens.

In the imaging device according to the aspect of the invention, it is preferable that the information related to a ray angle with respect to the image sensor is a stop value of the interchangeable lens or a numerical aperture of the interchangeable lens, the imaging device comprises a storager in which first tables showing the ratio between the output of the first pixel and the output of the second pixel at every image height are stored for every stop value of the interchangeable lens or every numerical aperture of the interchangeable lens, the pixel information acquisition section acquires outputs of the first pixels and outputs of the second pixels at a plurality of image heights on the image sensor, the arithmetic operator calculates ratios between the acquired outputs of the first pixels and the acquired outputs of the second pixels at the plurality of image heights, and acquires a second table showing the ratio at each image height, and the information acquisition section reads a stop value or a numerical aperture corresponding to a first table, which coincides with or is closest to the second table, from the storager on the basis of the acquired second table and acquires the read stop value or the read numerical aperture as the current stop value or the current numerical aperture of the interchangeable lens.

According to the aspect of the invention, the first tables (a plurality of first tables) showing the ratios at every image height are compared with the second table that is calculated by the arithmetic operator and shows the ratios at every image height, a first table coinciding with or closest to the second table is extracted, and a stop value or a numerical aperture corresponding to the extracted first table is acquired. Accordingly, a more accurate stop value or numerical aperture of the interchangeable lens can be acquired. Further, in this case, even though the first and second phase difference pixels are used as the first and second pixels and the incidence angle characteristics of the first phase difference pixel are completely symmetric with those of the second phase difference pixel, the incidence angle characteristics of the first phase difference pixel are not symmetric with those of the second phase difference pixel at the central portion of the image sensor in a case where the image height of the first phase difference pixel is different from the image height of the second phase difference pixel. That is, even though the first and second phase difference pixels are used as the first and second pixels, the current stop value or the current numerical aperture of the interchangeable lens can be acquired.

In the imaging device according to the aspect of the invention, it is preferable that the arithmetic operator calculates a ratio between the output of the unsaturated first pixel and the output of the unsaturated second pixel among the acquired first pixels and the acquired second pixels at the plurality of image heights and acquires the second table showing the ratio at each image height. The reason for this is that a ratio between the output of the first pixel and the output of the second pixel cannot be correctly calculated in a case where the first or second pixel is saturated.

It is preferable that the imaging device according to the aspect of the invention further comprises a contrast detection section that detects contrast of a subject, and the arithmetic operator increases the numbers of the first and second pixels, which are used for the calculation of the ratio, according to the contrast of the subject detected by the contrast detection section as the contrast of the subject is higher. In a case where the contrast of a subject is high, a ratio between the output of the first pixel and the output of the second pixel is affected by the contrast of the subject. Accordingly, in this case, calculated ratios are averaged by an increase in the numbers of the first and second pixels used for the calculation of a ratio. In a case where the numbers of the first and second pixels are to be increased and reduced, a method of widening and narrowing an area of the image sensor from which the first and second pixels are extracted and a method of changing extraction intervals (thinning-out rate) of the first and second pixels while maintaining a constant area from which the first and second pixels are extracted are considered.

It is preferable that the imaging device according to the aspect of the invention, it is preferable that a communication unit that communicates with the interchangeable lens and a control unit causing the pixel information acquisition section, the arithmetic operator, and the information acquisition section to operate in a case where the stop value or the numerical aperture of the interchangeable lens is not capable of being acquired from the mounted interchangeable lens through the communication unit. The reason for this is that a method of acquiring information about the interchangeable lens (a stop value or a numerical aperture of the interchangeable lens) by communication is convenient in a case where an interchangeable lens of the same company or an interchangeable lens having compatibility is used and information can be exchanged by communication between the interchangeable lens and an imaging device body. Accordingly, only in a case where a stop value or a numerical aperture of the interchangeable lens cannot be acquired from the mounted interchangeable lens through the communication unit, the pixel information acquisition section, the arithmetic operator, and the information acquisition section are adapted to operate to acquire a stop value or a numerical aperture of the interchangeable lens.

It is preferable that the imaging device according to the aspect of the invention further comprises a photometric unit that calculates brightness of a subject using a stop value or a numerical aperture of the interchangeable lens acquired through the communication unit or a stop value or a numerical aperture of the interchangeable lens acquired by the information acquisition section. In a case where a stop value or a numerical aperture of the interchangeable lens is known, the brightness of a subject (not the luminance of an image but the brightness of a real subject) can be calculated on the basis of information about "a stop value or a stop value converted from a numerical aperture", "shutter speed", and "the luminance (brightness) of an image". Further, the brightness of a real subject is used for the recognition of a scene (the determination of whether a scene is an outdoor scene or an indoor scene, and the like), and can be used for automatic white balance adjustment and the like.

It is preferable that the imaging device according to the aspect of the invention further comprises a phase shift distance-detection section that detects a phase shift distance on the basis of the outputs of the first and second phase difference pixels of the image sensor, a defocus distance-calculation section that calculates a defocus distance on the basis of the information related to a ray angle with respect to the image sensor and the phase shift distance, and a focus adjustment unit that moves the image sensor on the basis of the calculated defocus distance.

According to this, it is possible to perform phase-difference AF without driving the interchangeable lens by moving the image sensor, and to perform phase-difference AF even in a case where, particularly, an interchangeable lens having no compatibility is mounted.

It is preferable that the imaging device according to the aspect of the invention further comprises a mode setting section that sets an information acquisition mode, and the pixel information acquisition section, the arithmetic operator, and the information acquisition section operate in a case where an imaging instruction is input from an imaging instruction unit in a state where the information acquisition mode is set by the mode setting section.

In a case where the information acquisition mode is set, a user needs to image a subject in advance before main imaging to acquire information related to a ray angle with respect to the image sensor. Since the information acquisition mode is set, a user can image a subject (for example, a subject having low contrast, a subject not yet saturated, or the like) in consideration of imaging to acquire information related to a good ray angle. In a case where the stop of an interchangeable lens having no compatibility is adjusted, the information acquisition mode is set by a user whenever the stop of an interchangeable lens having no compatibility is adjusted. However, in a case where an interchangeable lens having no compatibility is mounted, the information acquisition mode may be automatically set through the detection of the mounting of the interchangeable lens.

It is preferable that the imaging device according to the aspect of the invention further comprises an image acquisition unit that acquires image data through the image sensor in a case where an imaging instruction is input from an imaging instruction unit and a recording unit that creates an image file storing the acquired image data and records the image file in a recording medium, and the recording unit records the information related to a ray angle with respect to the image sensor, which is acquired by the information acquisition section, in a header of the image file.

Another aspect of the invention provides an information acquisition method for an imaging device comprising an image sensor that includes a first pixel provided thereon and a second pixel provided thereon and having incidence angle characteristics different from incidence angle characteristics of the first pixel. The information acquisition method comprises: an pixel information-acquisition step of acquiring an output of the first pixel of the image sensor, on which subject light is incident through an interchangeable lens mounted on the imaging device, and an output of the second pixel; an arithmetic operation step of calculating a ratio between the acquired output of the first pixel and the acquired output of the second pixel; and an information-acquisition step of acquiring information related to a ray angle with respect to the image sensor in a case where the subject light is incident on the image sensor through the interchangeable lens on the basis of the calculated ratio.

In the information acquisition method according to another aspect of the invention, it is preferable that the imaging device comprises a storager in which the ratio between the output of the first pixel and the output of the second pixel is stored for each stop value of the interchangeable lens or each numerical aperture of the interchangeable lens, and, in the information-acquisition step, a stop value or a numerical aperture corresponding to the ratio is read from the storager on the basis of the calculated ratio and the read stop value or the read numerical aperture is acquired as the current stop value or the current numerical aperture of the interchangeable lens.

In the information acquisition method according to another aspect of the invention, it is preferable that the imaging device comprises a storager in which first tables showing the ratio between the output of the first pixel and the output of the second pixel at every image height are stored for every stop value of the interchangeable lens or every numerical aperture of the interchangeable lens, outputs of the first pixels and outputs of the second pixels at a plurality of image heights on the image sensor are acquired in the pixel information-acquisition step, ratios between the acquired outputs of the first pixels and the acquired outputs of the second pixels at the plurality of image heights are calculated and a second table showing the ratio at each image height is acquired in the arithmetic operation step, and a stop value or a numerical aperture corresponding to a first table, which coincides with or is closest to the second table, is read from the storager on the basis of the acquired second table, and the read stop value or the read numerical aperture is acquired as the current stop value or the current numerical aperture of the interchangeable lens in the information-acquisition step.

In the information acquisition method according to another aspect of the invention, it is preferable that the imaging device comprises a communication unit that communicates with the interchangeable lens, the method comprises a step of acquiring a stop value or a numerical aperture of the interchangeable lens from the mounted interchangeable lens through the communication unit, and processing of the pixel information-acquisition step, the arithmetic operation step, and the information-acquisition step is performed to acquire the current stop value or the current numerical aperture of the interchangeable lens in a case where the stop value or the numerical aperture of the interchangeable lens is not capable of being acquired through the communication unit.

Still another aspect of the invention provides an information acquisition program applied to an imaging device comprising an image sensor that includes a first pixel provided thereon and a second pixel provided thereon and having incidence angle characteristics different from incidence angle characteristics of the first pixel. The information acquisition program causes the imaging device to implement: a function of acquiring an output of the first pixel of the image sensor, on which subject light is incident through an interchangeable lens mounted on the imaging device, and an output of the second pixel; a function of calculating a ratio between the acquired output of the first pixel and the acquired output of the second pixel; and a function of acquiring information related to a ray angle with respect to the image sensor in a case where the subject light is incident on the image sensor through the interchangeable lens on the basis of the calculated ratio.

According to the invention, it is possible to simply and accurately acquire information related to a ray angle with respect to an image sensor in a case where subject light is incident on the image sensor through an interchangeable lens even though the interchangeable lens having no compatibility is mounted on the imaging device.

DESCRIPTION OF THE PREFERRED EMBODIMENTS

Preferred embodiments of an imaging device, an information acquisition method, and an information acquisition program according to the invention will be described below with reference to accompanying drawings.

<Appearance of Imaging Device>

Figure 1:
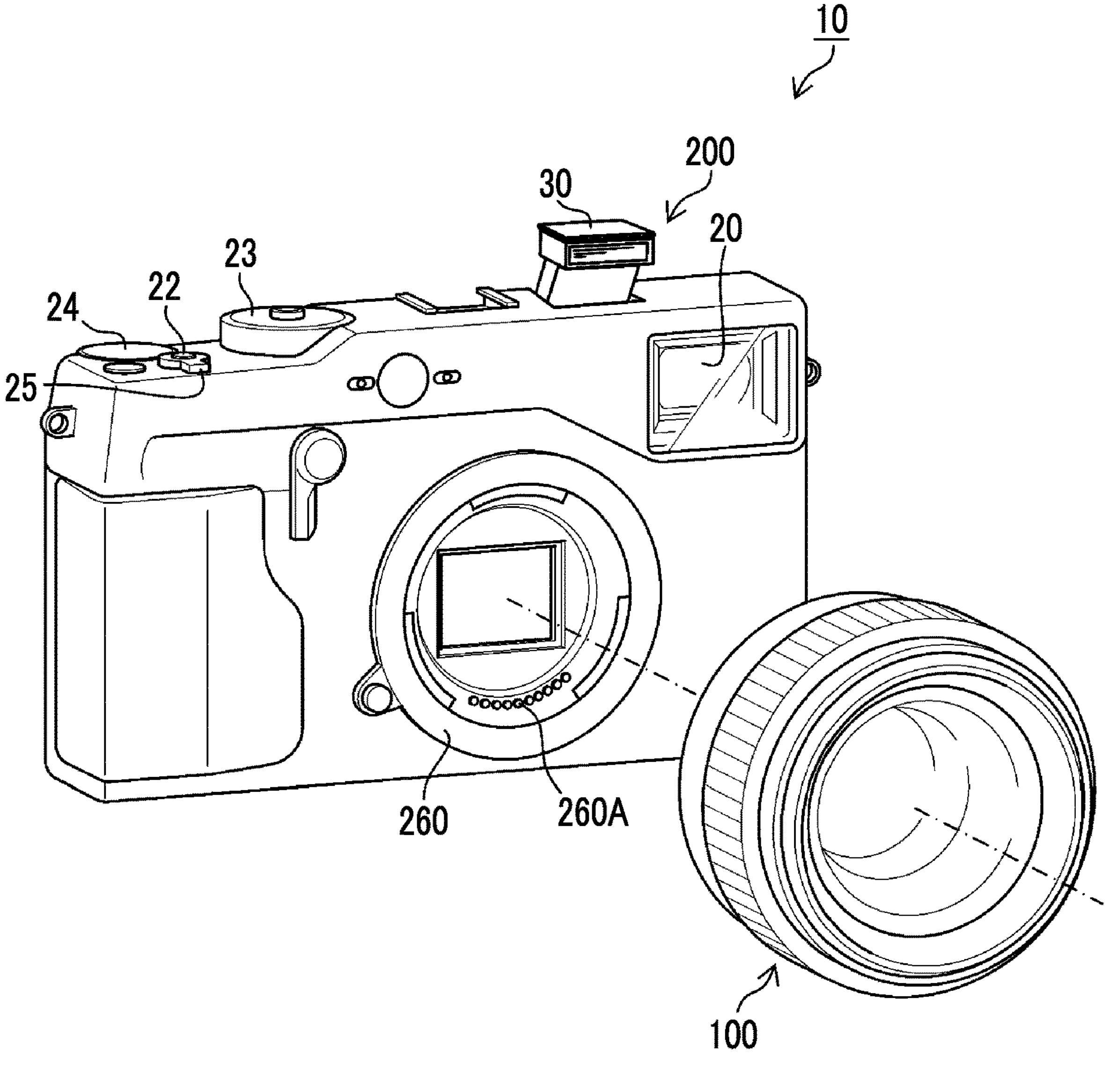
FIG. 1 is a perspective view of an imaging device according to the invention that is viewed obliquely from the front side.
Figure 2:
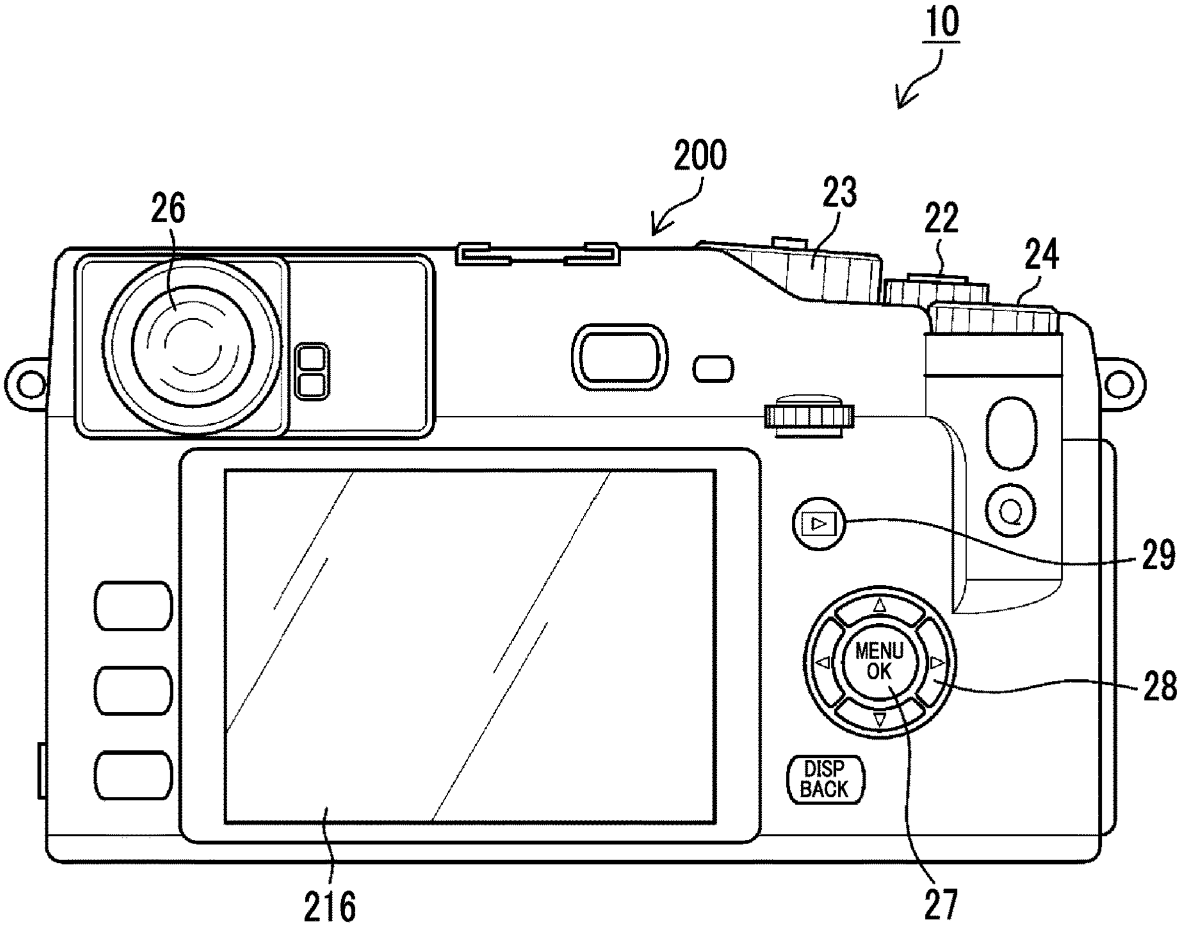
FIG. 2 is a back view of the imaging device.

FIG. 1 is a perspective view of an imaging device that is viewed obliquely from the front side, and FIG. 2 is a back view of the imaging device.

As shown in FIG. 1, an imaging device 10 is a mirrorless digital single-lens camera including an interchangeable lens 100 and a camera body 200 to and from which the interchangeable lens 100 is attachable and detachable.

In FIG. 1, a body mount 260 (mount part) to and from which the interchangeable lens 100 is attachable and detachable, a finder window 20 of an optical finder, and the like are provided on the front surface of the camera body 200, and a shutter release switch 22, a shutter speed dial 23, an exposure correction dial 24, a power lever 25, and a built-in flash 30 are mainly provided on the upper surface of the camera body 200.

As shown in FIG. 2, a monitor 216 formed of a liquid crystal display or the like, an eyepiece part 26 of the optical finder, a MENU/OK key 27, a cross key 28, a play button 29, and the like are mainly provided on the back surface of the camera body 200.

The monitor 216 functions as a display unit that displays various menu screens in addition to displaying a live view image in an imaging mode and playing back and displaying a taken image in a playback mode. The MENU/OK key 27 is an operation key having both a function as a menu button for giving a command to display a menu on the screen of the monitor 216 and a function as an OK button for giving a command to determine and perform selected contents and the like. The cross key 28 is an operation part that is used to input instructions in four directions of an upward direction, a downward direction, a left direction, and a right direction, and functions as a button that is used to select an item from the menu screen or is used to give an instruction to select various setting items from each menu. Further, an upper key and a lower key of the cross key 28 function as zoom switches at the time of imaging or play-zoom switches in the playback mode, and a left key and a right key thereof function as frame advance (fast-forward and rewind) buttons in the playback mode. Furthermore, the MENU/OK key 27, the cross key 28, and the menu screens displayed on the monitor 216 can be used to set various imaging modes including a continuous shooting mode where static images are to be continuously taken in addition to a normal imaging mode where a single static image is to be taken. A continuous shooting speed (for example, about 8 frames/sec, about 3 frames/sec) can be set in a case where the continuous shooting mode is set.

The play button 29 is a button that is used to switch a mode to the playback mode where the monitor 216 is caused to display taken and recorded static images or videos.

<Internal Configuration of Imaging Device>

[Interchangeable Lens]

<Interchangeable Lens Having No Compatibility>

Figure 3:
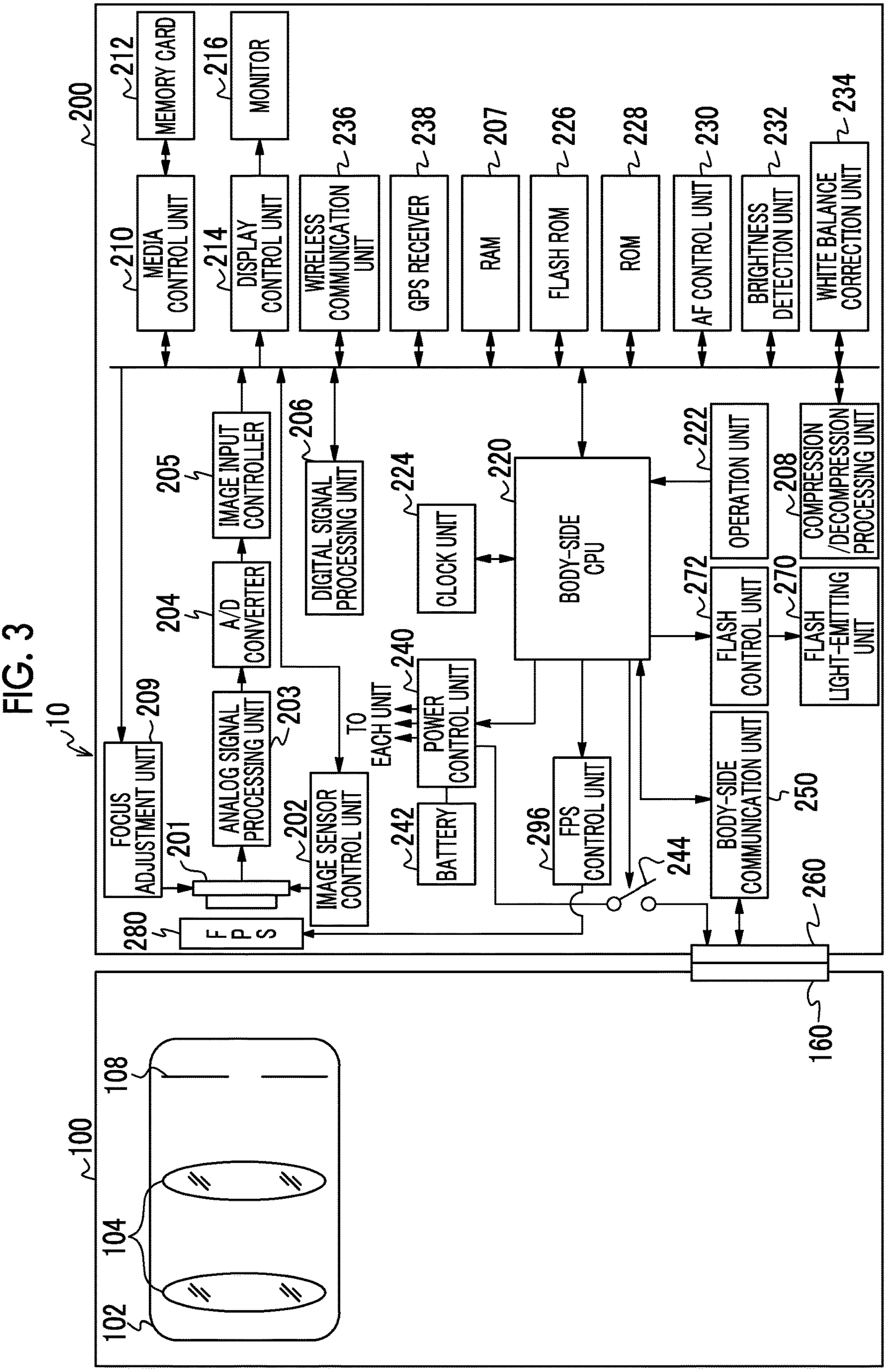
FIG. 3 is a block diagram showing an embodiment of the internal configuration of the imaging device, and is a diagram showing a state where an interchangeable lens having no compatibility is mounted.

FIG. 3 is a block diagram showing an embodiment of the internal configuration of the imaging device 10.

The interchangeable lens 100 shown in FIG. 3 is an interchangeable lens that comprises a lens mount 160 mountable on the body mount 260 of the camera body 200 but has no compatibility with the camera body 200. The interchangeable lens 100 also includes an interchangeable lens that can be mounted on the camera body 200 through a mount adapter (not shown).

An imaging optical system 102 of the interchangeable lens 100 includes a lens group 104 including a focus lens and a stop 108.

In a case where a focus ring (not shown) is manually operated, the focus lens of the lens group 104 can be moved in a range corresponding to a range from close to infinity.

In a case where a stop ring (not shown) is manually operated, the size of a stop aperture of the stop 108 can be changed from the maximum stop to the minimum stop one step or ⅓ step at a time or continuously. Accordingly, an F-Number can be set in a range from the maximum stop (for example, a stop value (F-Number) is F1.2) to the minimum stop (for example, an F-Number is F22).

<Interchangeable Lens Having Compatibility>

Figure 4:
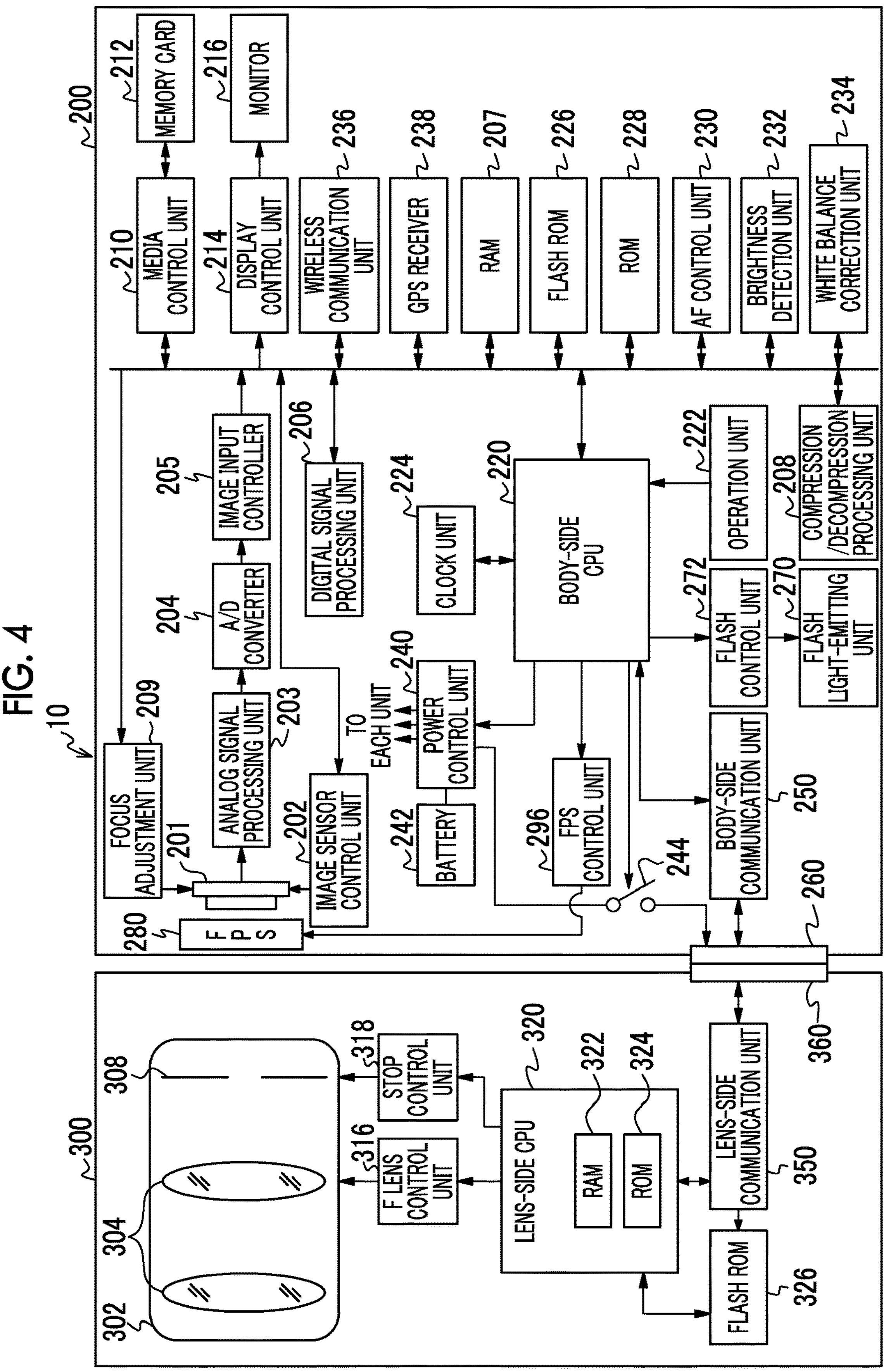
FIG. 4 is a block diagram showing an embodiment of the internal configuration of the imaging device, and is a diagram showing a state where an interchangeable lens having compatibility is mounted.

FIG. 4 is a block diagram showing a second embodiment of the internal configuration of the imaging device 10.

An interchangeable lens 300 shown in FIG. 4 is an interchangeable lens having compatibility that is manufactured according to the communication standards of the camera body 200 and can communicate with the camera body 200 as described later.

The interchangeable lens 300 comprises an imaging optical system 302, a focus lens control unit 316, a stop control unit 318, a lens-side central processing unit (CPU) 320, a flash read only memory (ROM) 326, a lens-side communication unit 350, and a lens mount 360.

The imaging optical system 302 of the interchangeable lens 300 includes a lens group 304 including a focus lens and a stop 308.

The focus lens control unit 316 controls the focus position of the focus lens according to a command from the lens-side CPU 320. The stop control unit 318 controls the stop 308 according to a command from the lens-side CPU 320.

The lens-side CPU 320 generally controls the interchangeable lens 300, and a ROM 324 and a random access memory (RAM) 322 are built in the lens-side CPU 320.

The flash ROM 326 is a non-volatile memory that stores a program and the like downloaded from the camera body 200.

The lens-side CPU 320 generally controls each part of the interchangeable lens 300 according to a control program stored in the ROM 324 or the flash ROM 326 while using the RAM 322 as a work area.

The lens-side communication unit 350 communicates with the camera body 200 through a plurality of signal terminals (lens-side signal terminals) provided on the lens mount 360 in a state where the lens mount 360 is mounted on the body mount 260 of the camera body 200. That is, the lens-side communication unit 350 transmits and receives a request signal and a response signal to and from (performs two-way communication with) a body-side communication unit 250 of the camera body 200, which is connected to the lens-side communication unit 350 through the lens mount 360 and the body mount 260, according to a command from the lens-side CPU 320; and notifies the lens information of the respective optical members of the imaging optical system 302 (the focus position information and focal length information of the focus lens, stop information, and the like) to the camera body 200.

Further, the interchangeable lens 300 comprises a detection unit (not shown) that detects the focus position information of the focus lens and stop information. Here, the stop information is information representing a stop value (F-Number) of the stop 308, the aperture diameter of the stop 308, and the like. In this example, an F-Number will be used as the stop information hereinafter.

It is preferable that the lens-side CPU 320 stores various kinds of lens information, which includes the detected focus position information and the detected stop information, in the RAM 322 to meet a request for lens information transmitted from the camera body 200. Further, the lens information is detected in a case where there is a request for the lens information transmitted from the camera body 200, is detected in a case where the optical member is driven, or is detected at regular intervals (an interval sufficiently shorter than the frame interval of a video); and detection results can be stored.

[Camera Body]

The camera body 200 of the imaging device 10 shown in FIG. 3 or 4 comprises an image sensor 201 (image acquisition unit), an image sensor control unit 202, an analog signal processing unit 203, an analog/digital (A/D) converter 204, an image input controller 205, a digital signal processing unit 206, a RAM 207, a compression/decompression processing unit 208, a focus adjustment unit 209, a media control unit 210 (recording unit), a memory card 212 (recording medium), a display control unit 214, a monitor 216, a body-side CPU 220, an operation unit 222, a clock unit 224, a flash ROM 226, a ROM 228, an AF control unit 230, a brightness detection unit 232 (photometric unit), a white balance correction unit 234, a wireless communication unit 236, a global positioning system (GPS) receiver 238, a power control unit 240, a battery 242, a body-side communication unit 250, a body mount 260, a flash light-emitting unit 270 and a flash control unit 272 of the built-in flash 30 (FIG. 1), a focal-plane shutter (FPS) 280, and an FPS control unit 296.

<Configuration of Image Sensor>

The image sensor 201 is formed of a complementary metal-oxide semiconductor (CMOS) color image sensor. The image sensor 201 is not limited to a CMOS color image sensor, and may be an XY address color image sensor or a charge coupled device (CCD) image sensor.

Figure 5:
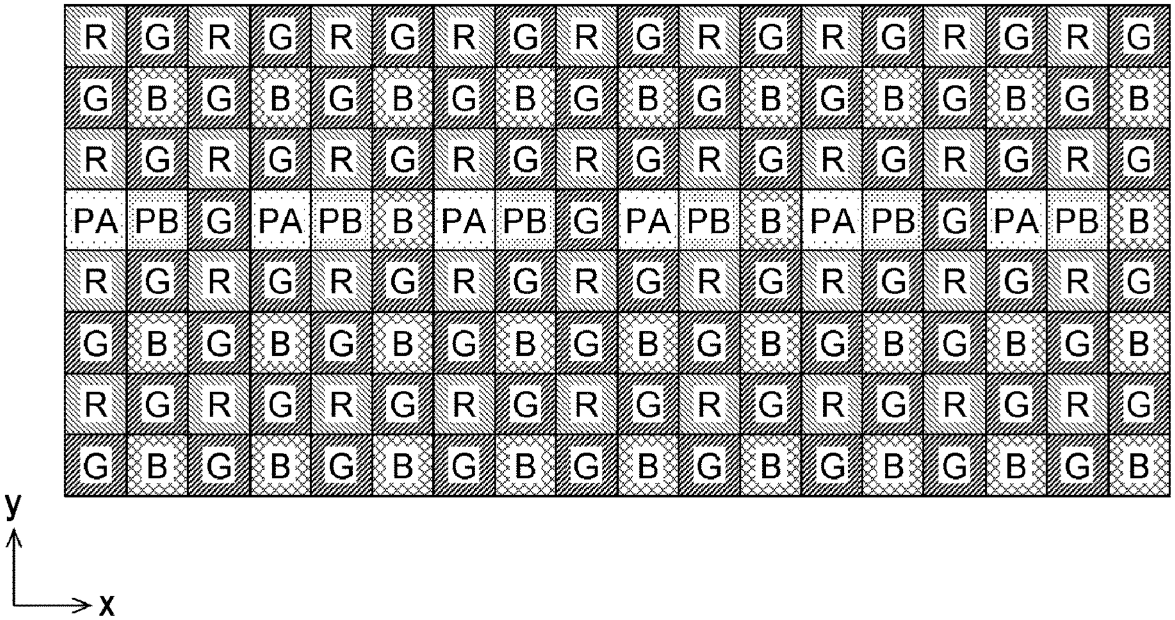
FIG. 5 is a diagram showing an example of the configuration of an image sensor.

In the image sensor 201, red (R) color filters, green (G) color filters, and blue (B) color filters are arranged in the form of a periodic color array (a general Bayer array in an example shown in FIG. 5) on a plurality of pixels formed of photoelectric conversion elements (photodiodes) two-dimensionally arrayed in an x direction (horizontal direction) and a y direction (vertical direction) as shown in FIG. 5, and a microlens is disposed on each photodiode.

Further, phase difference pixels (first phase difference pixels PA and second phase difference pixels PB) and normal pixels for imaging (pixels other than the phase difference pixels) are arranged in the image sensor 201.

In the image sensor 201 having a Bayer array, normal pixel rows in which only normal pixels are arranged in the horizontal direction (row direction) include RG rows in which pixels (R pixels) including R filters and which pixels (G pixels) including G filters are alternately arranged in the row direction and GB rows in which G pixels and pixels (B pixels) including B filters are alternately arranged in the row direction. Further, the RG rows and the GB rows are alternately arranged in the vertical direction (column direction).

Furthermore, the image sensor 201 includes a phase difference pixel row in which the first phase difference pixels PA and the second phase difference pixels PB are arranged and the normal pixel rows in which only normal pixels are arranged.

The phase difference pixel row of the image sensor 201 is formed so that three pixels, that is, a pair of first and second phase difference pixels PA and PB and one normal pixel are periodically arranged as one period in a specific GB row of the Bayer array in the row direction. Accordingly, in the phase difference pixel row, the G pixels and the B pixels are alternately arranged with two pixels (a pair of first and second phase difference pixels PA and PB) interposed therebetween in the row direction. The phase difference pixel row of this example is provided in the GB row of the Bayer array, but is not limited thereto. The phase difference pixel row may be provided in the RG row.

The periodic color array is not limited to the Bayer array, and may be other color filter arrays, such as an X-Trans (registered trademark) array.

Figure 6:
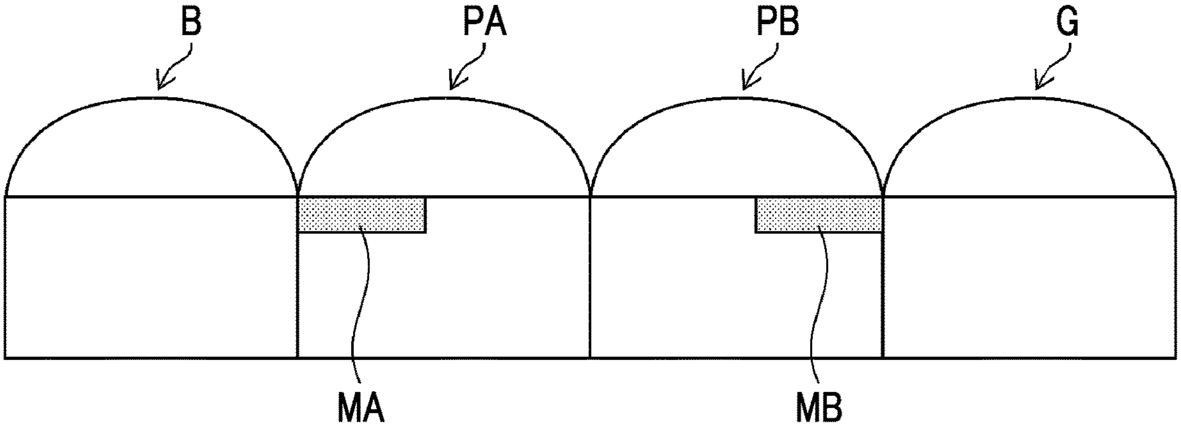
FIG. 6 is a schematic diagram showing the cross section of a part of a phase difference pixel row of the image sensor.

FIG. 6 is a schematic diagram showing the cross section of a part of the phase difference pixel row of the image sensor 201. FIG. 6 shows four pixels, that is, a pair of first and second phase difference pixels PA and PB and a B pixel and a G pixel which are normal pixels adjacent to the pair of first and second phase difference pixels PA and PB. The first and second phase difference pixels PA and PB are provided with light blocking films MA and MB that limit incidence light, respectively.

Figure 7:
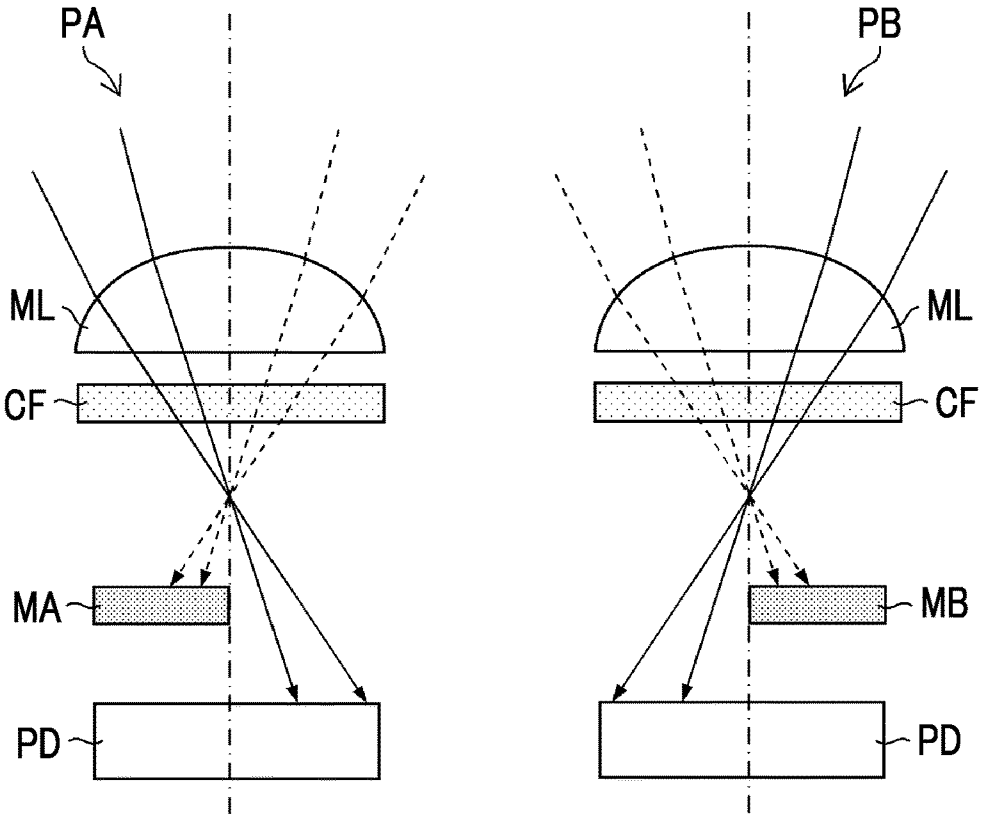
FIG. 7 is an enlarged view of main parts showing the configuration of a first phase difference pixel PA and a second phase difference pixel PB.

FIG. 7 is an enlarged view of main parts showing the configuration of the first and second phase difference pixels PA and PB.

As shown in FIG. 7, the light blocking film MA is provided on the front surface side (microlens ML side) of the photodiode PD of the first phase difference pixel PA and the light blocking film MB is provided on the front surface side of the photodiode PD of the second phase difference pixel PB. The microlenses ML and the light blocking films MA and MB have a pupil dividing function, and the light blocking film MA blocks light on the left half of the light-receiving surface of the photodiode PD in FIG. 7. For this reason, only luminous flux, which passes through the left side of an optical axis, of luminous flux passing through the exit pupil of the imaging optical system 102 is selectively received by the first phase difference pixel PA. Further, a G filter is disposed below the microlens ML as a color filter CF.

On the other hand, the light blocking film MB blocks light on the right half of the light-receiving surface of the photodiode PD of the second phase difference pixel PB. For this reason, only luminous flux, which passes through the right side of an optical axis, of luminous flux passing through the exit pupil of the imaging optical system 102 is selectively received by the second phase difference pixel PB. The luminous flux passing through the exit pupil is divided into left and right pieces in this way by the microlenses ML and the light blocking films MA and MB having a pupil dividing function, and is incident on the first and second phase difference pixels PA and PB, respectively.

Figure 8:
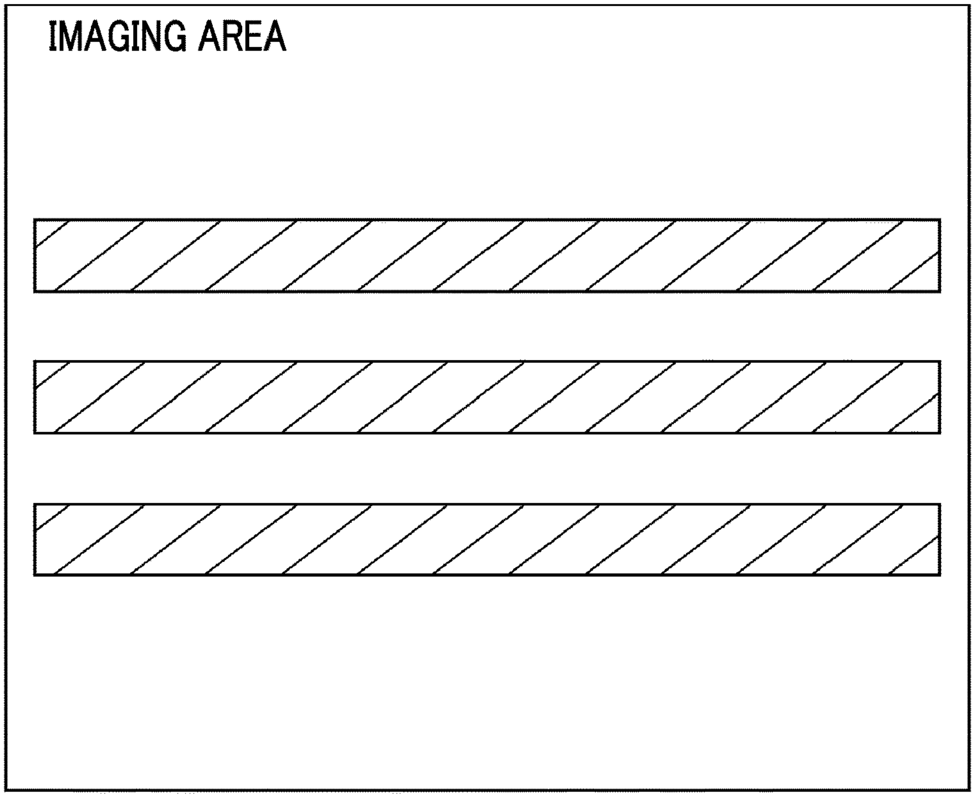
FIG. 8 is a diagram showing an example of an area, in which the first phase difference pixels PA and the second phase difference pixels PB are arranged, of the imaging area of the image sensor.
Figure 9:
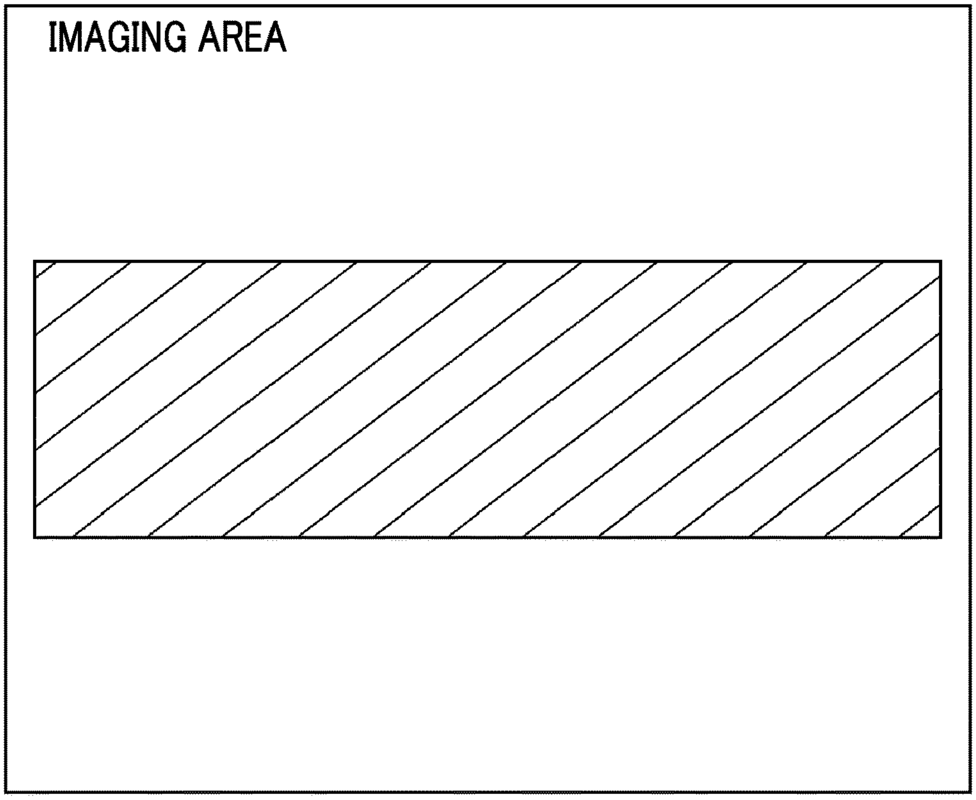
FIG. 9 is a diagram showing another example of the area, in which the first phase difference pixels and the second phase difference pixels are arranged, of the imaging area of the image sensor.
Figure 10:
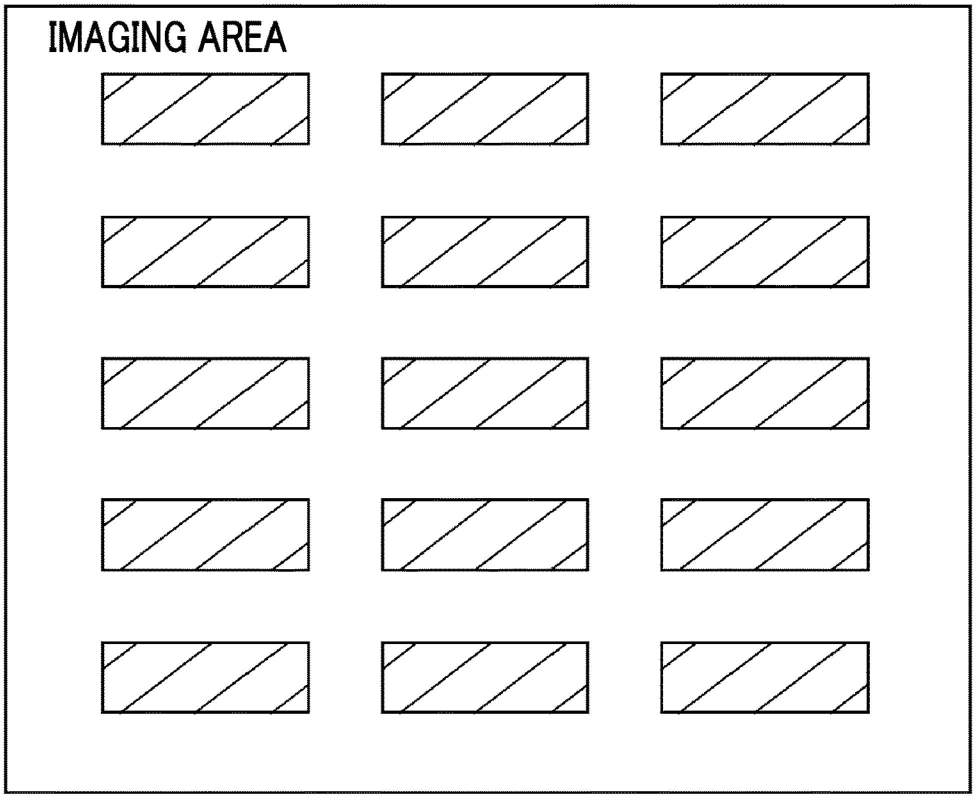
FIG. 10 is a diagram showing a still another example of the area, in which the first phase difference pixels PA and the second phase differences pixels PB are arranged, of the imaging area of the image sensor.

FIGS. 8 to 10 show examples of an area, in which the first and second phase difference pixels PA and PB are arranged, of the imaging area of the image sensor 201. In FIGS. 8 to 10, the area in which the first and second phase difference pixels PA and PB are arranged is shown by hatching.

Returning to FIG. 3, the image sensor 201 of this example is provided to be movable in the direction of the optical axis and the position of the image sensor 201 can be adjusted by the focus adjustment unit 209. Accordingly, in a case where the position of the image sensor 201 in the direction of the optical axis is controlled, a subject image can be caused to focus on the imaging surface of the image sensor 201.

The optical image of a subject, which is formed on the light-receiving surface of the image sensor 201 by the imaging optical system 102 of the interchangeable lens 100, is converted into electrical signals by the image sensor 201. Electric charges corresponding to the amount of light to be incident are accumulated in each pixel of the image sensor 201, and an electrical signal corresponding to the amount of electric charges accumulated in each pixel is read from the image sensor 201 as an image signal.

The image sensor control unit 202 controls the reading of the image signals from the image sensor 201 according to the command of the body-side CPU 220. Further, the image sensor control unit 202 has a function as an electronic shutter that simultaneously discharges (simultaneously resets) the electric charges accumulated in the respective pixels of the image sensor 201 to start exposure according to an electronic shutter control signal from the body-side CPU 220.

The analog signal processing unit 203 performs various kinds of analog signal processing on analog image signals that are obtained from the imaging of a subject performed by the imaging sensor 201. The analog signal processing unit 203 includes a sampling hold circuit, a color separation circuit, an automatic gain control (AGC) circuit, and the like. The AGC circuit functions as a sensitivity adjuster adjusting sensitivity (ISO sensitivity (ISO: International Organization for Standardization)) at the time of imaging, and adjusts the gain of an amplifier amplifying an image signal to be input to make the signal level of the image signal be in an appropriate range. The A/D converter 204 converts an analog image signal, which is output from the analog signal processing unit 203, into a digital image signal.

Image data (mosaic image data) for each of the RGB pixels, which are output through the image sensor 201, the analog signal processing unit 203, and the A/D converter 204 at the time of taking of a static image or a video, are input to the RAM 207 from the image input controller 205, and are temporarily stored in the RAM 207. In a case where the image sensor 201 is a CMOS image sensor, the analog signal processing unit 203 and the A/D converter 204 are often built in the imaging sensor 201.

The digital signal processing unit 206 performs various kinds of digital signal processing on the image data stored in the RAM 207. The digital signal processing unit 206 appropriately reads the image data stored in the RAM 207; performs digital signal processing, such as offset processing, gain-control processing including sensitivity correction, gamma correction processing, demosaic processing (also referred to as demosaicing processing or demosaicing), and RGB/YCrCb conversion processing, on the read image data; and stores the image data, which have been subjected to the digital signal processing, in the RAM 207 again. The demosaic processing is processing for calculating color information about all RGB colors for each pixel from a mosaic image including RGB colors in the case of an image sensor including, for example, color filters having the three RGB colors, and generates image data of three RGB surfaces, which have been subjected to demosaicing, from mosaic data (point-sequence RGB data).

The RGB/YCrCb conversion processing is processing for converting the RGB data, which have been subjected to demosaicing, into luminance data (Y) and color difference data (Cr and Cb).

The compression/decompression processing unit 208 performs compression processing on the luminance data Y and the color difference data Cb and Cr, which are temporarily stored in the RAM 207 and are not compressed, at the time of recording of a static image or a video. The compression/decompression processing unit 208 compresses a static image in, for example, joint photographic coding experts group (JPEG) format and compresses a video in, for example, H.264 format. Image data, which are compressed by the compression/decompression processing unit 208, are recorded in the memory card 212 through the media control unit 210. Further, the compression/decompression processing unit 208 performs decompression processing on the compressed image data that are obtained from the memory card 212 through the media control unit 210 in the playback mode, and generates uncompressed image data.

The media control unit 210 performs control to record the image data, which are compressed by the compression/decompression processing unit 208, in the memory card 212. Further, the media control unit 210 performs control to read the compressed image data from the memory card 212.

The display control unit 214 performs control to cause the monitor 216 to display the uncompressed image data that are stored in the RAM 207. The monitor 216 is formed of, for example, a display device, such as a liquid crystal display device or an organic electroluminescence display device.

In a case where the monitor 216 is to be caused to display a live view image, digital image signals continuously generated by the digital signal processing unit 206 are temporarily stored in the RAM 207. The display control unit 214 converts the digital image signals temporarily stored in the RAM 207 into a signal format for display, and sequentially outputs the converted digital image signals to the monitor 216. Accordingly, since a taken image is displayed on the monitor 216 in real time, the monitor 216 can be used as an electronic view finder.

The shutter release switch 22 is an imaging instruction unit that is used to input an imaging instruction, and is formed of a two-stage stroke switch that has a so-called "half press" stroke and a so-called "full press" stroke.

In an imaging mode for a static image, the shutter release switch 22 is half pressed to output an S1-on signal and the shutter release switch 22 is further pressed from the half-pressed state and is fully pressed to output an S2-on signal. In a case where an S1-on signal is output, the body-side CPU 220 performs imaging preparation processing, such as auto-focus (AF) control and auto exposure (AE) control. In a case where an S2-on signal is output, the body-side CPU 220 performs imaging processing and recording processing for a static image. It goes without saying that AF control and AE control are automatically performed in a case where an auto mode is set by the operation unit 222 and AF control and AE control are not performed in a case where a manual mode is set.

Further, in a case where the shutter release switch 22 is fully pressed to output an S2-on signal in an imaging mode for a video, the camera body 200 is made to be in a video recording mode where the recording of a video is to be started and performs image processing and recording processing for a video. Then, in a case where the shutter release switch 22 is fully pressed again to output an S2-on signal, the camera body 200 is made to be in a standby state and temporarily stops the recording processing for a video.

The shutter release switch 22 is not limited to the form of a two-stage stroke switch that has a "half press" stroke and a "full press" stroke. The shutter release switch 22 may output an S1-on signal and an S2-on signal by a single operation, or individual switches may be provided to output an S1-on signal and an S2-on signal, respectively.

Furthermore, in a form where an operation instruction is to be given by a touch panel or the like, an area corresponding to an operation instruction displayed on the screen of the touch panel may be touched as operation means to output the operation instruction. As long as an instruction to perform the imaging preparation processing or the imaging processing is given, the form of the operation means is not limited thereto.

A static image or a video, which is obtained from imaging, is compressed by the compression/decompression processing unit 208; compressed image data are converted into an image file having a header to which required additional information, such as the date and time of imaging, GPS information, and imaging conditions (an F-Number, a shutter speed, ISO sensitivity, and the like), are added; and the image file is then stored in the memory card 212 through the media control unit 210.

The body-side CPU 220 generally controls the operation of the entire camera body 200, the driving of the optical members of the interchangeable lens 100, and the like and controls the respective parts of the camera body 200 and the interchangeable lens 300 on the basis of inputs from the operation unit 222, which includes the shutter release switch 22, and the like.

The clock unit 224 functions as a timer and measures time on the basis of a command from the body-side CPU 220. Further, the clock unit 224 functions as a calendar and measures the current date and time.

The flash ROM 226 is a non-volatile memory where data can be read and written, and stores setting information.

A camera control program to be executed by the body-side CPU 220, information about the defects of the image sensor 201, and various parameters and tables used for image processing and the like are stored in the ROM 228. The body-side CPU 220 controls the respective parts of the camera body 200 and the interchangeable lens 300 according to the camera control program stored in the ROM 228 while using the RAM 207 as a work area.

The AF control unit 230 calculates a defocus distance required for the control of phase-difference AF, and controls the position of the image sensor 201 through the focus adjustment unit 209 on the basis of the calculated defocus distance.

Figure 11:
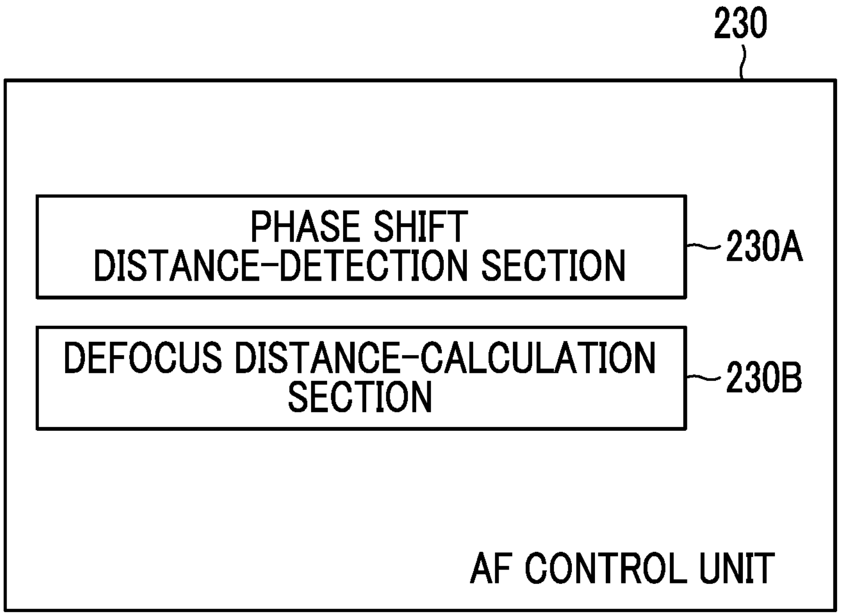
FIG. 11 is a diagram showing an example of the configuration of an AF control unit.

As shown in FIG. 11, the AF control unit 230 includes a phase shift distance-detection section 230A and a defocus distance-calculation section 230B.

The phase shift distance-detection section 230A detects a phase shift distance on the basis of the outputs of the first phase difference pixels PA and the outputs of the second phase difference pixels PB in the AF area of the image sensor 201. The phase shift distance can be calculated from the amount of shift between the respective output data that are obtained in a case where a correlation between the respective output data of the first phase difference pixels PA and the respective output data of the second phase difference pixels PB is maximum (in a case where an integrated value of the absolute values of differences between the respective output data of the first phase difference pixels PA and the respective output data of the second phase difference pixels PB is minimum).

The defocus distance-calculation section 230B calculates a defocus distance by multiplying the phase shift distance, which is detected by the phase shift distance-detection section 230A, and a coefficient, which corresponds to the current F-Number (ray angle) of the interchangeable lens 100, together.

In the case of the interchangeable lens 100 having no compatibility as in this example, the interchangeable lens 100 cannot be controlled by the camera body 200 but a focus can be automatically adjusted in a case where the image sensor 201 is moved in the direction of the optical axis by the focus adjustment unit 209.

That is, in a case where the AF control unit 230 performs AF control, the AF control unit 230 drives and controls the focus adjustment unit 209 on the basis of the defocus distance calculated by the defocus distance-calculation section 230B and moves the image sensor 201 by the calculated defocus distance. Accordingly, since the image sensor 201 can be moved to a position where a defocus distance is zero (a position where a phase difference is minimum), phase-difference AF for focusing a subject image on the imaging surface of the image sensor 201 can be performed.

AF is not limited to phase-difference AF and may be, for example, contrast AF. In the case of contrast AF, the AF control unit 230 extracts high-frequency components from G signals of G pixels (pixels including G color filters) provided in an AF area, calculates an integrated value (focus evaluation value) of the absolute values of the extracted high-frequency components, and moves the image sensor 201 to a position where the calculated focus evaluation value is maximum (that is, a position where contrast is maximum) through the focus adjustment unit 209.

The brightness detection unit 232 (photometric unit) is a part that detects the brightness of a subject (subject luminance), and calculates a numerical value (exposure value (EV value)) that corresponds to subject luminance and is required for AE control and auto white balance (AWB) control. The brightness detection unit 232 calculates an EV value from the luminance of an image acquired through the image sensor 201 and a shutter speed and an F-Number at the time of acquisition of the luminance of the image.

In the case of the interchangeable lens 300 having compatibility, the body-side CPU 220 can determine an F-Number, a shutter speed, and ISO sensitivity from a predetermined program diagram on the basis of the EV value obtained from the brightness detection unit 232 and can perform AE control.

Further, in the case of the interchangeable lens 100 having no compatibility, the body-side CPU 220 can determine a shutter speed and ISO sensitivity so that the luminance of the image acquired through the image sensor 201 becomes appropriate luminance and can perform AE control.

The white balance correction unit 234 calculates white balance (WB) gains Gr, Gg, and Gb of the respective color data of RGB data (R data, G data, and B data), and multiplies the R data, the G data, and the B data by the calculated WB gains Gr, Gg, and Gb, respectively, to perform white balance correction. Here, a method including specifying the type of a light source illuminating a subject on the basis of the recognition of a scene (the determination of whether a scene is an outdoor scene or an indoor scene, and the like) using the brightness (EV value) of the subject, the color temperature of ambient light, and the like, and reading a WB gain corresponding to a specified type of a light source from a storager in which WB gains suitable for the types of light sources are stored in advance is considered as a method of calculating the WB gains Gr, Gg, and Gb; but other publicly known methods of obtaining WB gains Gr, Gg, and Gb using at least an EV value may be considered.

The wireless communication unit 236 is a part that performs near field communication corresponding to standards, such as Wireless Fidelity (Wi-Fi) (registered trademark) and Bluetooth (registered trademark), and transmits and receives necessary information to and from digital gadgets (portable terminals, such as a smartphone) positioned therearound.

The GPS receiver 238 receives GPS signals, which are transmitted from a plurality of GPS satellites, according to an instruction of the body-side CPU 220, performs positioning computation processing based on the plurality of received GPS signals, and acquires GPS information that includes the latitude, the longitude, and the altitude of the camera body 200. The acquired GPS information can be recorded in the header of an image file as additional information that represents a position where the taken image is taken.

The power control unit 240 supplies power supply voltage, which is supplied from the battery 242, to each part of the camera body 200 according to the command of the body-side CPU 220. Further, the power control unit 240 supplies power supply voltage, which is supplied from the battery 242, to each part of the interchangeable lens 300 having compatibility through the body mount 260 and the lens mount 160 according to the command of the body-side CPU 220.

A lens power switch 244 performs the switching of ON and OFF of the power supply voltage, which is supplied to the interchangeable lens 300 through the body mount 260 and the lens mount 360 according to the command of the body-side CPU 220, and the switching of the level of the power supply voltage.

The body-side communication unit 250 transmits and receives a request signal and a response signal to and from (performs two-way communication with) the lens-side communication unit 350 of interchangeable lens 300, which is connected to the body-side communication unit 250 through the body mount 260 and the lens mount 360, according to the command of the body-side CPU 220. Since the body mount 260 is provided with a plurality of terminals 260A as shown in FIG. 1, the plurality of terminals 260A (FIG. 1) of the body mount 260 and the plurality of terminals (not shown) of the lens mount 360 are electrically connected to each other in a case where the interchangeable lens 300 is mounted on the camera body 200 (the lens mount 360 and the body mount 260 are connected to each other). Accordingly, two-way communication can be performed between the body-side communication unit 250 and the lens-side communication unit 350.

The built-in flash 30 (FIG. 1) is, for example, a Through The Lens (TTL) automatic dimming flash, and includes the flash light-emitting unit 270 and the flash control unit 272.

The flash control unit 272 has a function of adjusting the amount (guide number) of flash light that is emitted from the flash light-emitting unit 270. That is, the flash control unit 272 causes the flash light-emitting unit 270 to emit flash light in synchronization with a flash imaging instruction from the body-side CPU 220, starts the photometry of reflected light (including ambient light) that is incident through the imaging optical system 102 or 302 of the interchangeable lens 100 or 300, and stops the emission of the flash light from the flash light-emitting unit 270 in a case where a photometric value reaches a standard exposure value.

The focal-plane shutter (FPS) 280 forms the mechanical shutter of the imaging device 10, and is disposed right in front of the image sensor 201. The FPS control unit 296 controls the opening and closing of a front curtain and a rear curtain of the FPS 280 on the basis of information (an S2-on signal, a shutter speed, and the like) input from the body-side CPU 220 and controls the exposure time (shutter speed) of the image sensor 201.

[Principle of Information Acquisition Method]

Next, the principle of a method of acquiring information related to a ray angle with respect to the image sensor 201 in a case where the interchangeable lens 100 having no compatibility is mounted on the camera body 200 and subject light is incident on the image sensor 201 through the interchangeable lens 100 will be described. "F-Number" of the interchangeable lens 100 will be described below as information related to a ray angle with respect to the image sensor 201 by way of example.

Figure 12:
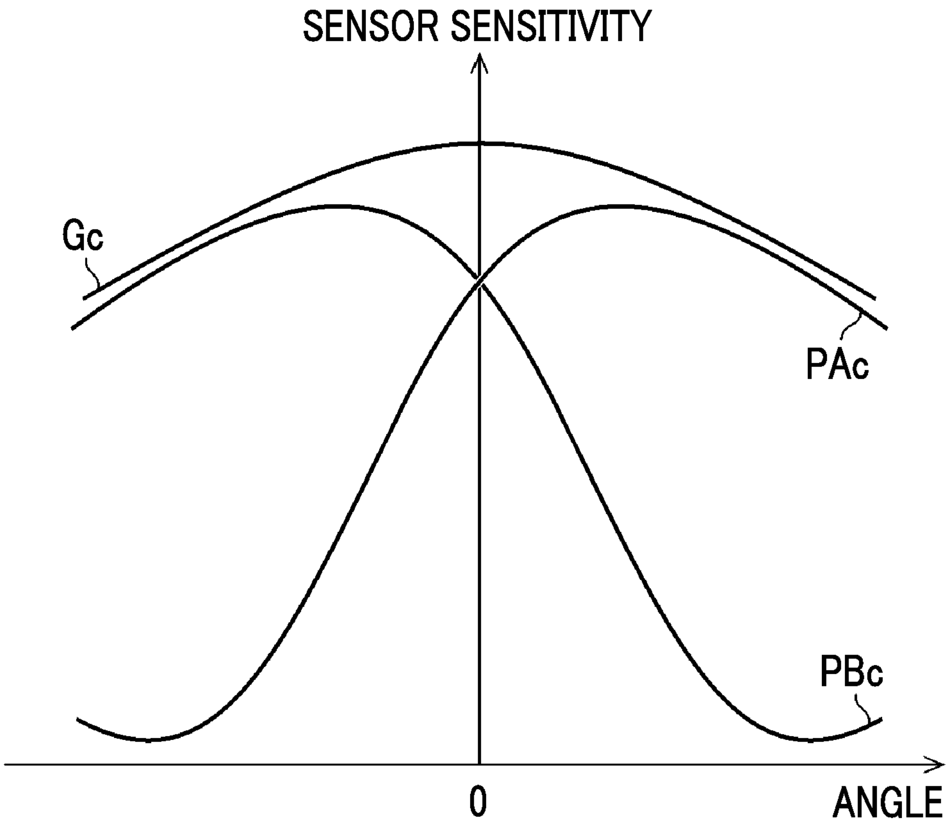
FIG. 12 is a graph showing the incidence angle characteristics of a normal pixel (G pixel), the first phase difference pixel, and the second phase difference pixel of the image sensor.

FIG. 12 is a graph showing the incidence angle characteristics of the normal pixel (G pixel), the first phase difference pixel PA, and the second phase difference pixel PB of the image sensor 201, and shows the sensitivity Ge of the normal pixel (G pixel), the sensitivity PAc of the first phase difference pixel PA, and the sensitivity PBc of the second phase difference pixel PB with respect to an angle between the image sensor 201 and the x direction (horizontal direction).

As shown in FIG. 12, the sensitivity Gc of the G pixel is highest and the sensitivities PAc and PBc of the first and second phase difference pixels PA and PB are lower than that of the G pixel. Further, light to be incident on the left half of the opening of the first phase difference pixel PA is blocked by the light blocking film MA and light to be incident on the right half of the opening of the second phase difference pixel PB is blocked by the light blocking film MB. Accordingly, the sensitivity PAc of the first phase difference pixel PA and the sensitivity PBc of the second phase difference pixel PB are symmetric with respect to a center where an incidence angle is zero, and the positions of the peaks of the sensitivities thereof are shifted from each other.

Figure 13:
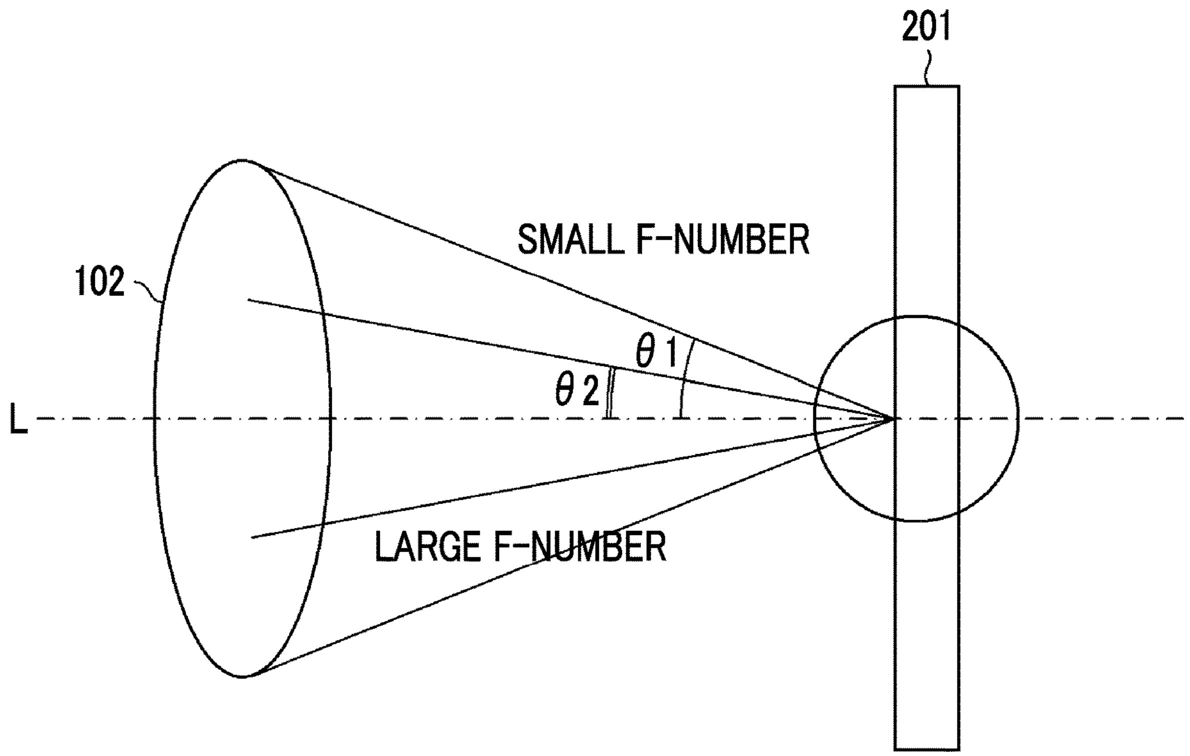
FIG. 13 is a diagram showing a state where luminous flux including a main ray parallel to an optical axis of an imaging optical system and having different F-Numbers is incident on the image sensor.

FIG. 13 shows cases where luminous flux including a main ray parallel to an optical axis L of the imaging optical system 102 is incident on the image sensor 201, that is, a case where an F-Number is large and a case where an F-Number is small.

In FIG. 13, θ1 denotes an angle (ray angle) between a main ray (in this case, the optical axis L) in a case where an F-Number is small and an upper ray (a ray passing through an upper edge of the exit pupil or the entrance pupil), and θ2 denotes a ray angle between a main ray in a case where an F-Number is large and the upper ray.

Figure 14:
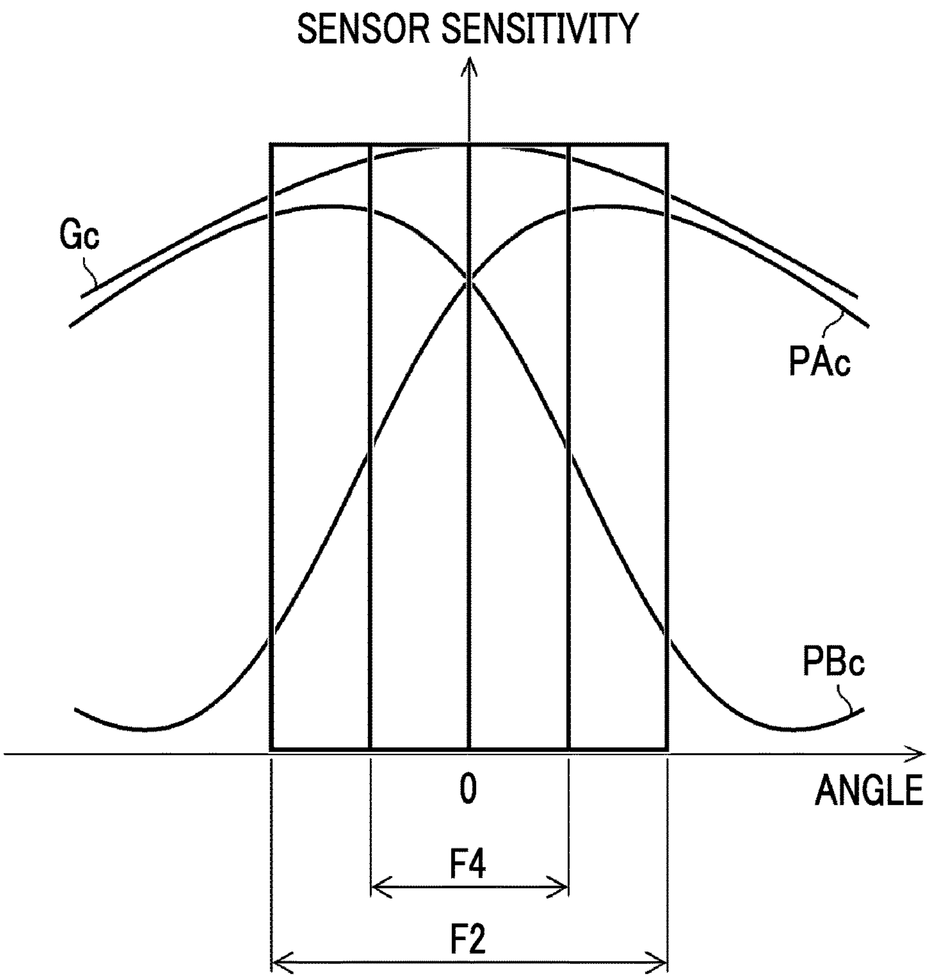
FIG. 14 is a diagram showing a graph that shows the incidence angle characteristics of the G pixel, the first phase difference pixel PA, and the second phase difference pixel PB of the image sensor and the angle ranges of luminous flux that is incident on pixels positioned at a central portion of the image sensor in a case where an F-Number is F2 and a case where an F-Number is F4.

FIG. 14 is a diagram showing the graph (the graph shown in FIG. 12) that shows the incidence angle characteristics of the G pixel, the first phase difference pixel PA, and the second phase difference pixel PB of the image sensor 201 and the angle ranges of luminous flux that is incident on pixels (the G pixel, the first phase difference pixel PA, and the second phase difference pixel PB) positioned at a central portion of the image sensor 201 in a case where an F-Number is F2 and a case where an F-Number is F4.

As shown in FIG. 14, the angle range of luminous flux to be incident is large (the ray angle θ1 of FIG. 13 is large) in a case where an F-Number is small (F2), and the angle range of luminous flux to be incident is small (the ray angle θ2 of FIG. 13 is large) in a case where an F-Number is large (F4).

New, in a case where a ratio between the output of the first phase difference pixel PA (or the second phase difference pixel PB) positioned at a central portion of the image sensor 201 and the output of the G pixel positioned at the central portion is calculated, a ratio varying depending on an F-Number is obtained. For example, in a case where a ratio of the output of the first phase difference pixel PA positioned at a central portion of the image sensor 201 to the output of the G pixel positioned at the central portion is calculated, the calculated ratio is smaller as an F-Number is smaller. The reason for this is that the image sensor 201 has characteristics where the position of the peak of the sensitivity Pac of the first phase difference pixel PA is shifted from the zero of an incidence angle and the sensitivity of the first phase difference pixel in a direction opposite to a direction where the position of the peak is shifted becomes lower than the sensitivity of the G pixel suddenly.

Accordingly, a ratio between the output of the first phase difference pixel PA (or the second phase difference pixel PB) and the output of the G pixel is stored for each F-Number in a storager, such as the flash ROM 226 or the ROM 228, in advance, and imaging for acquiring an F-Number is performed in a case where the current F-Number of the interchangeable lens 100 is acquired. Then, a ratio between the output of the first phase difference pixel PA (or the second phase difference pixel PB) and the output of the G pixel acquired from the imaging for acquiring an F-Number is calculated and a corresponding F-Number is read from the storager on the basis of the calculated ratio, so that an F-Number can be acquired.

Figure 15:
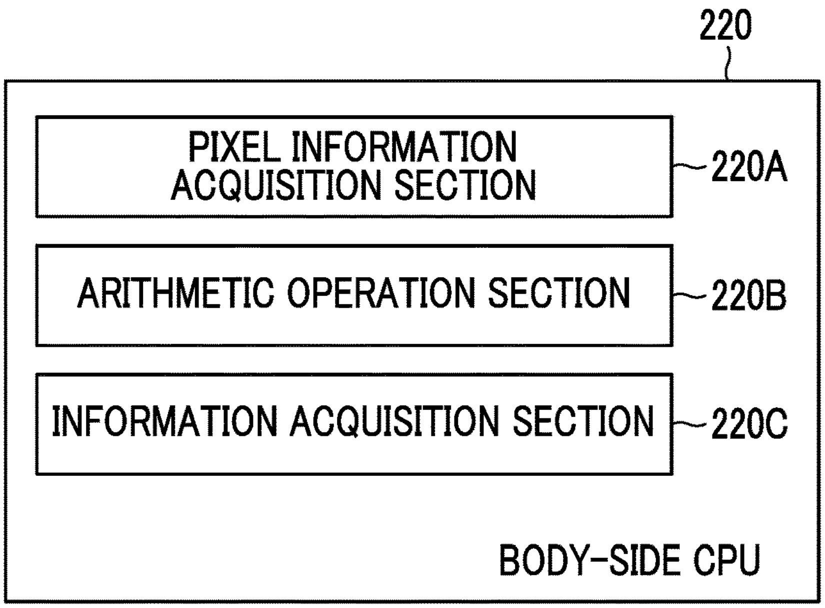
FIG. 15 is a block diagram showing the functions of a body-side CPU that acquires the current F-Number of an interchangeable lens.

FIG. 15 is a block diagram showing the functions of the body-side CPU 220 of the camera body 200 that acquires (estimates) the current F-Number of the interchangeable lens 100.

As shown in FIG. 15, the body-side CPU 220 (imaging device) functions as various processing units by executing a program for estimating an F-Number (information acquisition program) stored in the flash ROM 226 or the ROM 228, and has functions as a pixel information acquisition section 220A, an arithmetic operator (arithmetic operation section) 220B, and an information acquisition section 220C in this embodiment. A medium in which the information acquisition program is stored may be non-transitory computer-readable recording mediums, such as a hard disk, a compact disk (CD), a digital versatile disk (DVD), and various semiconductor memories.

The operation unit 222 of the imaging device 10 is provided with a mode setting section that is used to set an information acquisition mode (F-Number acquisition mode). In a case where a user operates the stop ring of the interchangeable lens 100 to switch the F-Number of the stop 108, the user operates the mode setting section to set the F-Number acquisition mode and performs the imaging for acquiring an F-Number. It is preferable that the imaging for acquiring an F-Number is to image a subject having low contrast or is to take an image in a blurred state. The reason for this is that it is preferable that the amount of light to be incident on the respective pixels of the G pixel and the first phase difference pixel PA (or the second phase difference pixel PB) used for the acquisition of an F-Number is uniform.

In a case where an imaging instruction is input from the shutter release switch 22 functioning as the imaging instruction unit in a state where the F-Number acquisition mode is set by the mode setting section, the pixel information acquisition section 220A, the arithmetic operator 220B, and the information acquisition section 220C of the body-side CPU 220 perform operations for acquiring an F-Number to be described below.

The pixel information acquisition section 220A acquires the respective output data (pixel information) of the first phase difference pixel PA (or the second phase difference pixel PB) and the G pixel, which are used for the acquisition of an F-Number, among the image data that are obtained through the interchangeable lens 100, the image sensor 201, and the like from the imaging for acquiring an F-Number.

In this example, the pixel information acquisition section 220A acquires the respective output data of the first phase difference pixel PA (first pixel) and the G pixel (second pixel) that are positioned at the central portion of the image sensor 201.

The arithmetic operator 220B calculates a ratio between the output data of the first phase difference pixel PA (the output of the first pixel) and the output data of the G pixel (the output of the second pixel) that are acquired by the pixel information acquisition section 220A.

In a case where a ratio between the output data of the first phase difference pixel PA and the output data of the G pixel is calculated by the arithmetic operator 220B, it is preferable that the numbers of the first phase difference pixels PA and the G pixels used for the calculation of the ratio are large. The reason for this is that a ratio between the output data of the first phase difference pixel PA and the output data of the G pixel varies due to an influence of the contrast of a subject in a case where the contrast of the subject is high.

Further, the number of pixels used for the calculation of a ratio between the output data of the first phase difference pixel PA and the output data of the G pixel (the size of an area from which pixel information is acquired) may be changed according to the contrast of a subject in a case where the imaging for acquiring an F-Number is performed.

Specifically, the imaging device 10 is provided with a contrast detection section that detects the contrast of a subject. In a case where the AF control unit 230 includes a contrast detection section, the existing contrast detection section included in the AF control unit 230 can be used as the contrast detection section. In a case where the AF control unit 230 does not include a contrast detection section, adding a contrast detecting function to the body-side CPU 220 is considered.

Then, the contrast of a subject in a case where the imaging for acquiring an F-Number is performed is detected by the contrast detection section. That is, the contrast detection section extracts high-frequency components from the output data of the G pixels of the entire imaging area of the image sensor 201 or an area (contrast detection area) smaller than the entire imaging area and including the central portion of the image sensor 201 which are acquired from the imaging for acquiring an F-Number, and calculates an integrated value of the absolute values of the extracted high-frequency components as a contrast evaluation value. As the contrast of a subject in the contrast detection area is higher, the contrast evaluation value calculated by the contrast detection section is larger.

As the contrast of a subject is higher, the arithmetic operator 220B increases the numbers of the first phase difference pixels PA and the G pixels, which are used for the calculation of the ratio, according to the contrast of the subject detected by the contrast detection section.

Further, since contrast (the degree of blur) can be known from a phase shift distance detected by the phase shift distance-detection section 230A of the AF control unit 230, the numbers of the first phase difference pixels PA and the G pixels to be used may be changed according to the phase shift distance.

Furthermore, in a case where the arithmetic operator 220B uses the respective output data of a plurality of first phase difference pixels PA and the respective output data of a plurality of G pixels to calculate a ratio between the output data of the first phase difference pixel PA and the output data of the G pixel, it is preferable that the arithmetic operator 220B calculates the ratio while excluding saturated pixels (255 or a value close to the 255 in a case where the output data is 8-bit data).

The information acquisition section 220C acquires information related to a ray angle with respect to the image sensor 201 (an F-Number in this example) in a case where subject light is incident on the image sensor 201 through the interchangeable lens 100 on the basis of the ratio calculated by the arithmetic operator 220B.

Specifically, the imaging device 10 comprises a storager, such as the flash ROM 226 or the ROM 228, in which a ratio between the output data of the first phase difference pixel PA and the output data of the G pixel is stored for each F-Number of the interchangeable lens 100. A table representing a relationship between the ratio and an F-Number may be stored in the ROM 228 before the shipment of products, or a table representing a relationship between the ratio and an F-Number may be downloaded from a server on the network and may be stored in the flash ROM 226.

The information acquisition section 220C reads an F-Number corresponding to the ratio, which is calculated by the arithmetic operator 220B, from the flash ROM 226 or the ROM 228 on the basis of the ratio, and acquires the read F-Number as the current F-Number of the interchangeable lens 100. In a case where the calculated ratio and the F-Number corresponding to the ratio are not stored in the flash ROM 226 or the ROM 228, a ratio closer to the calculated ratio may be employed on the basis of the calculated ratio and two ratios, which are stored in the front and rear of the calculated ratio, to read one F-Number of two F-Numbers corresponding to the two stored ratios, or two F-Numbers corresponding to two ratios, which are stored with the calculated ratio interposed therebetween, may be interpolated on the basis of the calculated ratio and the two stored ratios, to calculate an F-Number.

According to this embodiment, even in a case where the interchangeable lens 100 having no compatibility is mounted on the camera body 200, the current F-Number of the interchangeable lens 100 can be simply and accurately acquired. Further, since the current F-Number of the interchangeable lens 100 can be acquired without the addition of special hardware in the case of the imaging device 10 comprising the image sensor 201 including phase difference pixels, the imaging device 10 can be provided as an inexpensive device. In a case where the interchangeable lens 300 having compatibility is mounted on the camera body 200, the interchangeable lens 300 and the camera body 200 can communicate with each other and the camera body 200 can acquire lens information including an F-Number from the interchangeable lens 300 through communication. Accordingly, an F-Number does not need to be estimated by this embodiment.

Further, in a case where "F-Number" of the interchangeable lens 100 is acquired, the brightness of a subject (not the luminance of an image but the brightness of a real subject) can be calculated on the basis of information about "a shutter speed" and "the luminance (brightness) of an image". Furthermore, the brightness of a real subject is used for the recognition of a scene (the determination of whether a scene is an outdoor scene or an indoor scene, and the like), and can be used for automatic white balance adjustment and the like.

A ratio between the output data of the first phase difference pixel PA and the output data of the normal pixel (G pixel) is calculated in the embodiment, but the invention is not limited thereto. A ratio between the output data of the second phase difference pixel PB and the output data of the normal pixel (G pixel) may be calculated, and an F-Number may be acquired on the basis of the calculated ratio.

On the other hand, in a case where a ratio between the output data of the first phase difference pixel PA, which is positioned at the central portion of the image sensor 201, and the output data of the second phase difference pixel PB is calculated, the sensitivity PAc of the first phase difference pixel PA and the sensitivity PBc of the second phase difference pixel PB are symmetric with respect to a center where an incidence angle is zero as shown in FIG. 14. Accordingly, the ratio between the output data of the first phase difference pixel PA and the output data of the second phase difference pixel PB is not changed depending on an F-Number.

Figure 16:
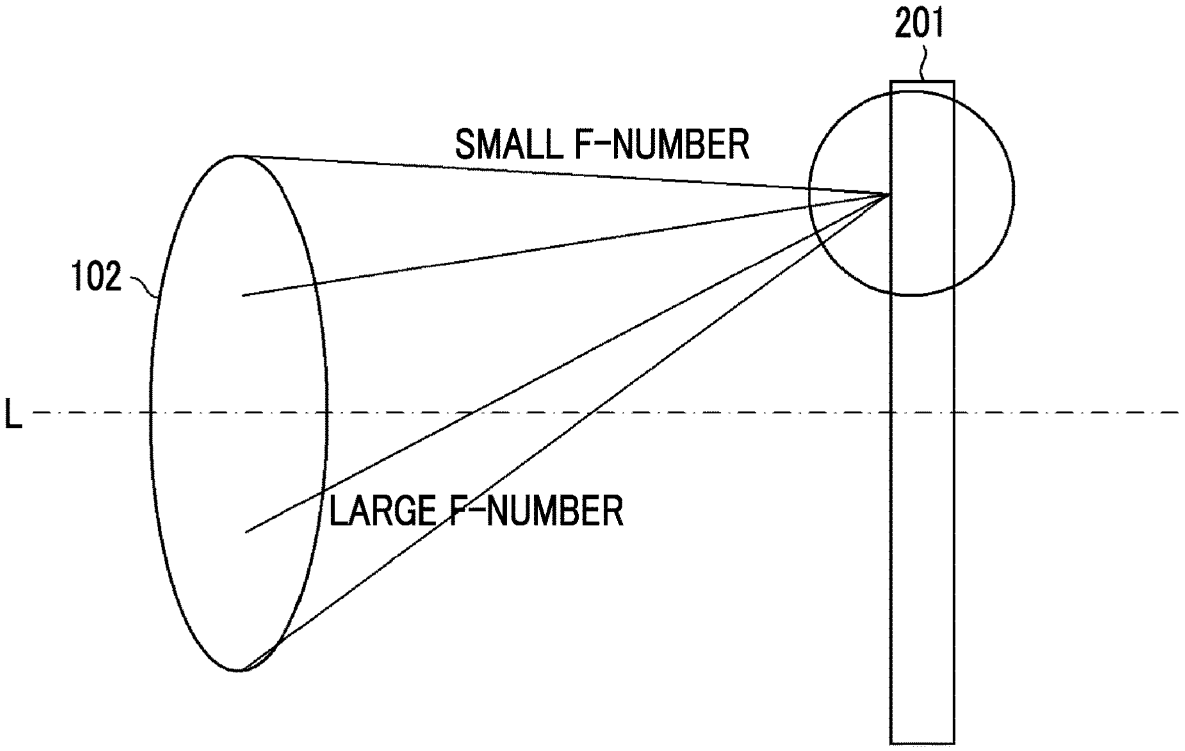
FIG. 16 is a diagram showing the image heights of the first and second phase difference pixels PA and PB, which are used for the acquisition of an F-Number, on the image sensor.

Accordingly, in a case where the first and second phase difference pixels PA and PB are used as the first and second pixels used for the acquisition of an F-Number, first and second phase difference pixels PA and PB positioned at a position where an image height on the image sensor 201 is high are used as shown in FIG. 16.

Figure 17:
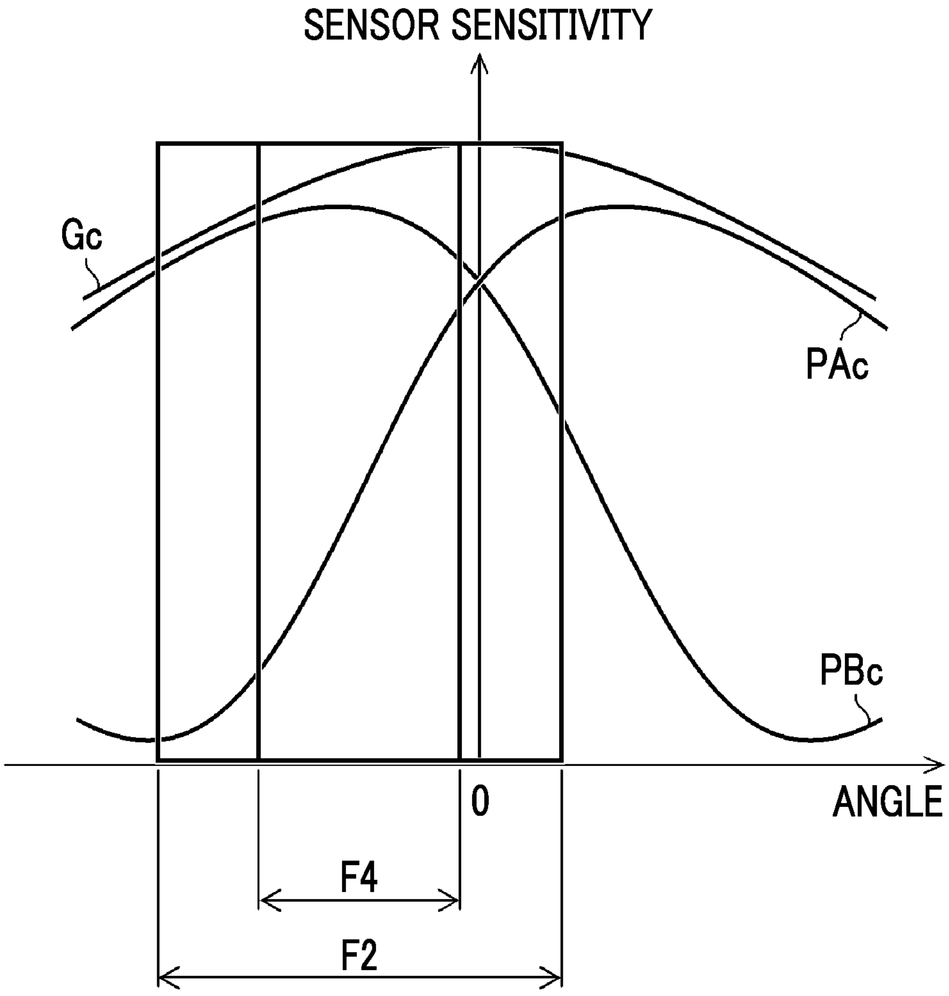
FIG. 17 is a diagram showing a graph that shows the incidence angle characteristics of the G pixel, the first phase difference pixel PA, and the second phase difference pixel PB of the image sensor and the angle ranges of luminous flux that is incident on certain pixels of which the image heights on the image sensor are high in a case where an F-Number is F2 and a case where an F-Number is F4.

FIG. 17 is a diagram showing the graph (the graph shown in FIG. 12) that shows the incidence angle characteristics of the G pixel, the first phase difference pixel PA, and the second phase difference pixel PB of the image sensor 201 and the angle ranges of luminous flux that is incident on certain pixels (the G pixel, the first phase difference pixel PA, and the second phase difference pixel PB) of which the image heights on the image sensor 201 are high in a case where an F-Number is F2 and a case where an F-Number is F4.

As shown in FIG. 17, the sensitivity PAc of the first phase difference pixel PA and the sensitivity PBc of the second phase difference pixel PB are not symmetric with respect to a main ray in the first and second phase difference pixels PA and PB positioned at a position where an image height on the image sensor 201 is high.

Accordingly, in a case where a ratio between the output of the first phase difference pixel PA, which is positioned at a position where an image height on the image sensor 201 is high, and the output of the second phase difference pixel PB, which is positioned at the position, is calculated, a ratio varying depending on an F-Number (for example, F2 and F4) is obtained.

It goes without saying that a ratio between the output of the first phase difference pixel PA (or the second phase difference pixel PB), which is positioned at a position where an image height on the image sensor 201 is high, and the output of the G pixel, which is positioned at the position, may be calculated.

Further, since three types of pixels (the first phase difference pixels, the second phase difference pixels, and the normal pixels) having different incidence angle characteristics are present in the image sensor 201 of this example, there are three combinations of two pixels of these three types of pixels. Accordingly, a maximum of three ratios can be obtained.

In a case where three or more types of pixels having different incidence angle characteristics are present as described above, a plurality of ratios can be obtained. In a case where the F-Number of the interchangeable lens 100 is estimated using the plurality of ratios, a more accurate F-Number can be estimated.

A ratio between the outputs of two pixels, which have different incidence angle characteristics and are positioned at the central portion of the image sensor 201, is calculated in the example shown in FIG. 13, and a ratio between the outputs of two pixels, which have different incidence angle characteristics and are positioned at a position where an image height on the image sensor 201 is high, is calculated in the example shown in FIG. 16. However, as shown in FIG. 18, a ratio between the outputs of two pixels having different incidence angle characteristics is calculated at each of sensor positions where image heights on the image sensor 201 are different, and the current F-Number of the interchangeable lens 100 may be estimated from the change of the calculated ratio.

Figure 18:
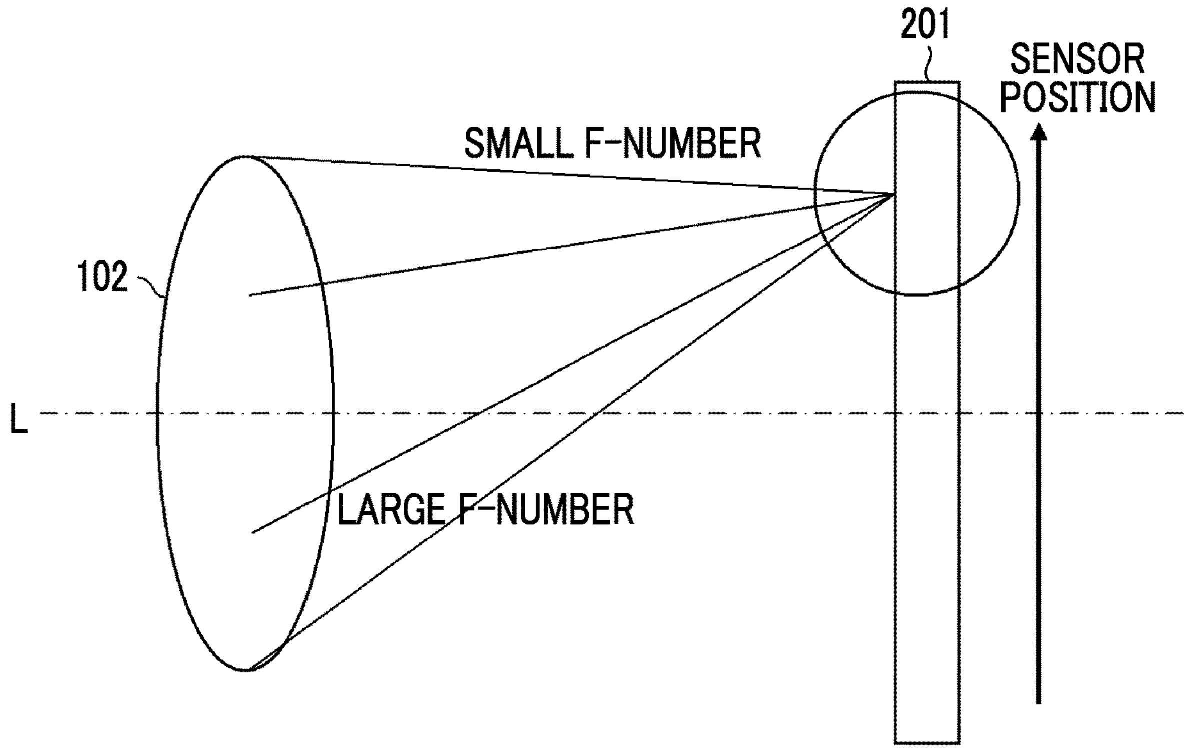
FIG. 18 is a diagram showing an example where the outputs of two pixels having different incidence angle characteristics are acquired at each of sensor positions where image heights on the image sensor are different.

Here, as shown in FIG. 18, the sensor positions where image heights on the image sensor 201 are different are positions different from the sensor center (x=0) of the image sensor 201, which corresponds to the optical axis L, in the x direction of the image sensor 201 that is the pupil-dividing direction of the first and second phase difference pixels PA and PB.

Figure 19:
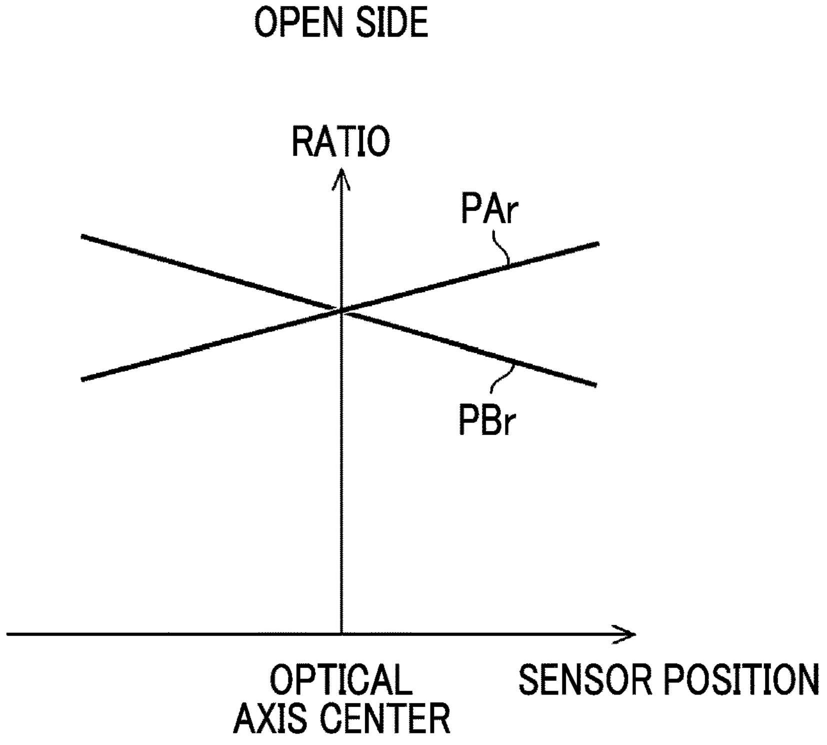
FIG. 19 is a graph showing the changes of ratios at every sensor position in a case where a stop of the interchangeable lens is positioned on an open side.
Figure 20:
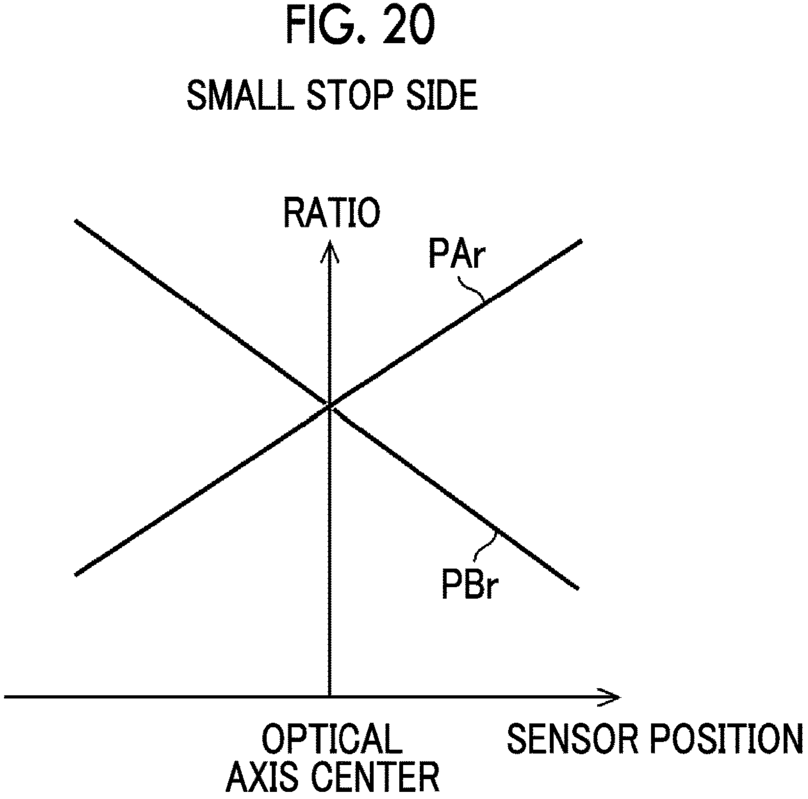
FIG. 20 is a graph showing the changes of ratios at every sensor position in a case where the stop of the interchangeable lens is positioned on a small stop side.

FIGS. 19 and 20 are graphs showing the changes of ratios at every sensor position in cases where the stop 108 of the interchangeable lens 100 is positioned on an open side and a small stop side, respectively.

In FIGS. 19 and 20, PAr denotes a ratio of the output of the first phase difference pixel PA to the output of the G pixel and PBr denotes a ratio of the output of the second phase difference pixel PB to the output of the G pixel.

As shown in FIGS. 19 and 20, the change of the ratio PAr or the ratio PBr at every sensor position in a case where the stop 108 is positioned on the open side is small (a gradient is small) and the change of the ratio PAr or the ratio PBr at every sensor position in a case where the stop 108 is positioned on the small stop side is large (a gradient is large)

Since the change of the ratio PAr or the ratio PBr varies according to whether the stop 108 of the interchangeable lens 100 is positioned on the open side or the small stop side (that is, according to an F-Number) as described above, an F-Number can be estimated according to how the ratio PAr or the ratio PBr is changed depending on the sensor position.

Specifically, the imaging device 10 comprises a storager, such as the flash ROM 226 or the ROM 228, in which first tables showing ratios PAr between the output data of the first phase difference pixels PA and the output data of the G pixels at every image height (sensor position) are stored for every F-Number of the interchangeable lens 100. The first tables may be stored in the ROM 228 for every F-Number of the interchangeable lens 100 before the shipment of products, or may be downloaded for every F-Number of the interchangeable lens 100 from a server on the network and may be stored in the flash ROM 226.

The pixel information acquisition section 220A acquires the output data of the first phase difference pixels PA and the output data of the G pixels at a plurality of image heights on the image sensor 201; and the arithmetic operator 220B calculates ratios between the acquired output data of the first phase difference pixels PA and the acquired output data of the G pixels at the plurality of image heights and acquires a second table showing the ratios at every image height.

The information acquisition section 220C reads an F-Number corresponding to a first table, which coincides with or is closest to the second table calculated by the arithmetic operator 220B, from the flash ROM 226 or the ROM 228 on the basis of the second table, and acquires the read F-Number as the current F-Number of the interchangeable lens 100.

The first and second tables are not limited to tables that are created on the basis of ratios between the outputs of the first phase difference pixels PA and the outputs of the G pixels (ratios at every sensor position), and may be tables that are created on the basis of a ratio between the output of the second phase difference pixel PB and the output of the G pixel and a ratio between the output of the first phase difference pixel PA and the output of the second phase difference pixel PB. Further, the ratios PAr or the ratios PBr at every sensor position shown in FIGS. 19 and 20 are linearly changed but are not limited thereto.

In this embodiment, the F-Number of the interchangeable lens 100 is acquired as information related to a ray angle with respect to the image sensor 201 in a case where subject light is incident on the image sensor 201 through the interchangeable lens 100. However, the information related to a ray angle with respect to the image sensor 201 is not limited thereto, and the numerical aperture of the interchangeable lens 100 or a ray angle at the sensor center may be acquired. Further, the information related to a ray angle with respect to the image sensor 201 includes not only a ray angle at the sensor center but also, for example, ray angles with respect to a pixel at other positions of the image sensor 201.

Figure 21:
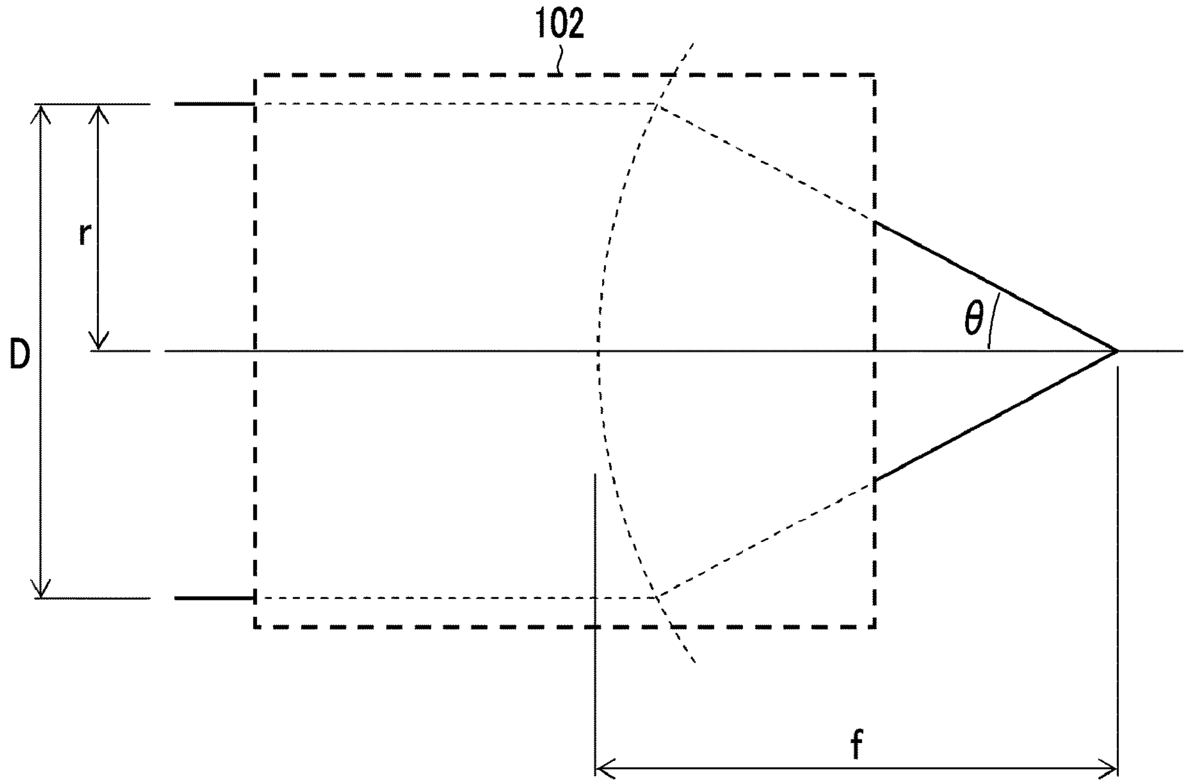
FIG. 21 is a diagram showing a relationship between an aperture diameter D, a radius r of the aperture diameter, a focal length f, and a ray angle θ of a lens.

FIG. 21 is a diagram showing a relationship between an aperture diameter D, a radius r of the aperture diameter D, a focal length f, and a ray angle θ of the imaging optical system 102.

An F-Number can be represented by the following equation using the definition of an F-Number.

$$F=f/D \quad \text{[Equation 1]}$$

Further, in a case where sine conditions are satisfied in the aperture diameter D, the radius r of the aperture diameter D, the focal length f, and the ray angle θ of the imaging optical system 102 shown in FIG. 21, sin θ can be represented by the following equation.

$$\sin\theta=r/f=D/(2f) \quad \text{[Equation 2]}$$

An F-Number can be represented from [Equation 1] and [Equation 2] by the following equation.

$$F=1/(2\sin\theta) \quad \text{[Equation 3]}$$

Further, a numerical aperture NA in the air can be represented by the following equation.

$$NA=\sin\theta \quad \text{[Equation 4]}$$

Furthermore, an F-Number and a numerical aperture are related to each other by the following equation.

$$F=1/(2NA) \quad \text{[Equation 5]}$$

An F-Number, a numerical aperture, and a ray angle are related to each other as described above. Accordingly, in a case where one of these is known, the other two thereof can be converted.

The F-Number of the interchangeable lens 100 is estimated in this example, but a numerical aperture or a ray angle can be acquired from the estimated F-Number through conversion.

Further, since a ratio between the outputs of the first and second pixels having different incidence angle characteristics is stored for each numerical aperture of the interchangeable lens having no compatibility in the storager, a corresponding numerical aperture can be read (acquired) from the storager from the ratio between the outputs of the first and second pixels. Furthermore, an F-Number or a ray angle can also be converted from the acquired numerical aperture.

Even in a case where the interchangeable lens 100 having no compatibility is mounted on the camera body 200 as described above, the current F-Number of the interchangeable lens 100 and the like can be estimated. Accordingly, the brightness of a subject can be calculated, or a scene can be recognized using the brightness of a subject. Further, even in a case where the interchangeable lens 100 having no compatibility is mounted on the camera body 200, an F-Number or a numerical aperture can be recorded in the header of an image file as the additional information of a taken image.

[Information Acquisition Method]

Figure 22:
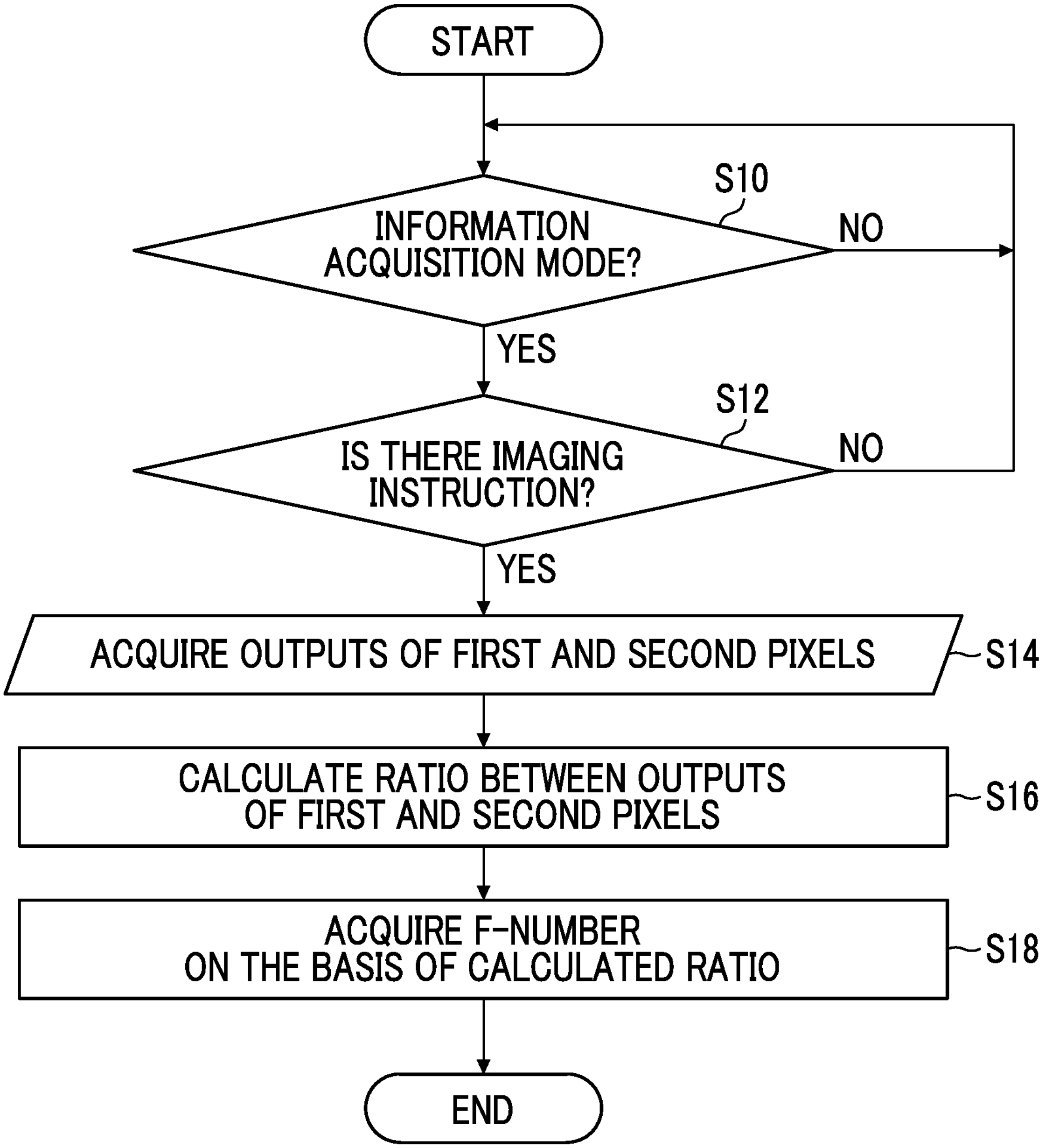
FIG. 22 is a flowchart showing a first embodiment of an information acquisition method according to the invention.

FIG. 22 is a flowchart showing a first embodiment of an information acquisition method according to the invention.

In FIG. 22, the body-side CPU 220 determines whether or not the F-Number acquisition mode (information acquisition mode) is set by the operation unit 222 (Step S10). In a case where the F-Number acquisition mode is set, the body-side CPU 220 further determines whether or not an imaging instruction (S2-on signal) is output from the shutter release switch 22 (Step S12).

In a case where the F-Number acquisition mode is set and an S2-on signal is output, the body-side CPU 220 performs imaging for acquiring an F-Number and the pixel information acquisition section 220A of the body-side CPU 220 acquires the respective output data of the first pixel (G pixel) and the second pixel (first phase difference pixel PA), which have different incidence angle characteristics and are positioned at the central portion of the image sensor 201, among image data that are acquired from the imaging for acquiring an F-Number (Step S14, pixel information-acquisition step).

The arithmetic operator 220B of the body-side CPU 220 calculates a ratio between the output data of the first and second pixels (the first phase difference pixel PA and the G pixel) acquired in Step S14 (Step S16, arithmetic operation step).

The information acquisition section 220C of the body-side CPU 220 acquires an F-Number on the basis of the ratio calculated in Step S16 (Step S18, information-acquisition step). The acquisition of the F-Number in Step S18 is performed in a case where an F-Number corresponding to the calculated value is read from the flash ROM 226 or the ROM 228 in which a table showing a relationship between a ratio between the first and second pixels having different incidence angle characteristics and an F-Number is stored.

Figure 23:
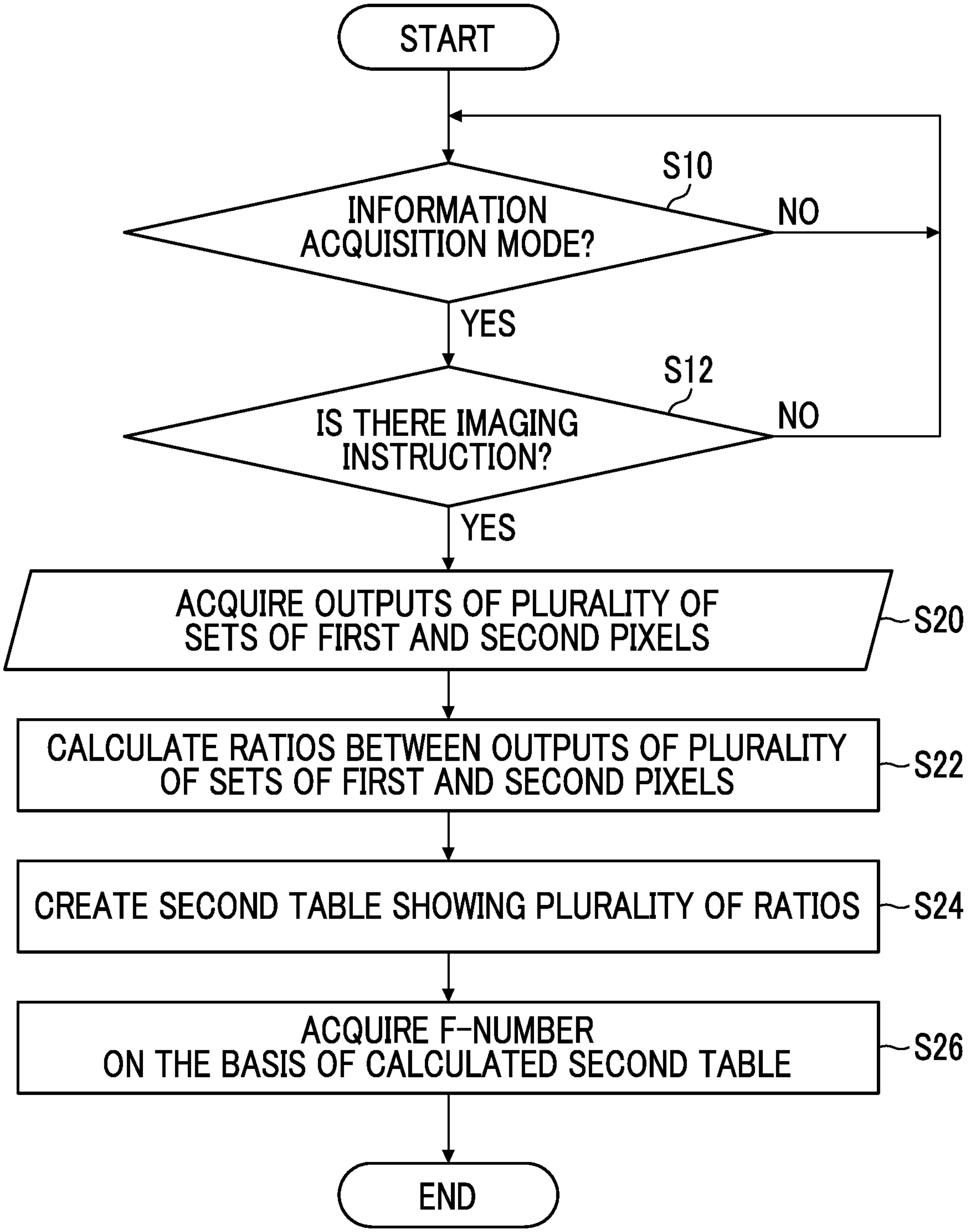
FIG. 23 is a flowchart showing a second embodiment of the information acquisition method according to the invention.

FIG. 23 is a flowchart showing a second embodiment of the information acquisition method according to the invention. Portions shown common to the first embodiment shown in FIG. 22 are denoted by the same step numbers as those of FIG. 22, and the detailed description thereof will be omitted.

In FIG. 23, in a case where the F-Number acquisition mode is set and an S2-on signal is output, the body-side CPU 220 performs imaging for acquiring an F-Number and the pixel information acquisition section 220A of the body-side CPU 220 acquires the respective output data of a plurality of sets of first and second pixels (the first phase difference pixels PA and the G pixels), which are positioned at a plurality of sensor positions where image heights are different, among image data that are acquired from the imaging for acquiring an F-Number (Step S20, pixel information-acquisition step).

The arithmetic operator 220B of the body-side CPU 220 calculates ratios between the output data of the plurality of sets of first and second pixels (the first phase difference pixels PA and the G pixels) (at every image height) acquired in Step S20 (Step S22), and generates a second table showing the ratios at every image height (Step S24).

The information acquisition section 220C of the body-side CPU 220 acquires the current F-Number of the interchangeable lens 100 on the basis of the second table generated in Step S24 (Step S26). First tables showing ratios between the output data of the first and second pixels at every image height (sensor position) are stored for every F-Number of the interchangeable lens 100 in the flash ROM 226 or the ROM 228 in advance. In regard to the acquisition of the F-Number in Step S26, an F-Number corresponding to a first table, which coincides with or is closest to the second table generated in Step S24, is read from the flash ROM 226 or the ROM 228 and the read F-Number is acquired as the current F-Number of the interchangeable lens 100.

OTHERS

The image sensor applied to the invention includes both the normal pixels and the phase difference pixels (first and second phase difference pixels), but an image sensor including only phase difference pixels without including normal pixels may be applied. In the case of the image sensor including only phase difference pixels, the same outputs as the normal pixels can be obtained through the addition of the outputs of a pair of first and second phase difference pixels adjacent to each other.

Further, in this embodiment, the hardware structures of processing units, which perform various kinds of processing, such as the pixel information acquisition section 220A, the arithmetic operator 220B, and the information acquisition section 220C, are various processors to be described later. Various processors include: a central processing unit (CPU) that is a general-purpose processor functioning as various processing units by executing software (program); a programmable logic device (PLD) that is a processor of which the circuit configuration can be changed after the manufacture, such as a field programmable gate array (FPGA); a dedicated electrical circuit that is a processor having circuit configuration designed exclusively to perform specific processing, such as an application specific integrated circuit (ASIC); and the like.

One processing unit may be formed of one of these various processors, or may be formed of two or more same kind or different kinds of processors (for example, a combination of a plurality of FPGAs or a combination of a CPU and an FPGA). Further, a plurality of processing units may be formed of one processor. As an example where a plurality of processing units are formed of one processor, first, there is an aspect where one processor is formed of a combination of one or more CPUs and software as typified by a computer, such as a client or a server, and functions as a plurality of processing units. Second, there is an aspect where a processor implementing the functions of the entire system, which includes a plurality of processing units, by one integrated circuit (IC) chip is used as typified by System On Chip (SoC) or the like. In this way, various processing units are formed using one or more of the above-mentioned various processors as hardware structures.

In addition, the hardware structures of these various processors are more specifically electrical circuitry where circuit elements, such as semiconductor elements, are combined.

Further, it goes without saying that the invention is not limited to the above-mentioned embodiments and has various modifications without departing from the scope of the invention.

EXPLANATION OF REFERENCES

10: imaging device
20: finder window
22: shutter release switch
23: shutter speed dial
24: exposure correction dial
25: power lever
26: eyepiece part
27: MENU/OK key
28: cross key
29: play button
30: built-in flash
100, 300: interchangeable lens
102, 302: imaging optical system
104, 304: lens group
108, 308: stop
160, 360: lens mount
200: camera body
201: image sensor
202: image sensor control unit
203: analog signal processing unit
204: A/D converter
205: image input controller
206: digital signal processing unit
207: RAM
208: compression/decompression processing unit
209: focus adjustment unit
210: media control unit
212: memory card
214: display control unit
216: monitor
220: body-side CPU
220A: pixel information acquisition section
220B: arithmetic operator (arithmetic operation section)
220C: information acquisition section
222: operation part
224: clock unit
226: flash ROM
228: ROM
230: AF control unit
230A: phase shift distance-detection section
230B: defocus distance-calculation section
232: brightness detection unit
234: white balance correction unit
236: wireless communication unit
238: GPS receiver
240: power control unit
242: battery
244: lens power switch
250: body-side communication unit
260: body mount
270: flash light-emitting unit
272: flash control unit
296: FPS control unit
316: focus lens control unit
318: stop control unit
320: lens-side CPU
322: RAM
324: ROM
326: flash ROM
350: lens-side communication unit
D: aperture diameter
Gc, PAc, PBc: sensitivity
L: optical axis
MA, MB: light blocking film
ML: microlens
NA: numerical aperture
PA: first phase difference pixel
PAr, PBr: ratio
PB: second phase difference pixel
PD: photodiode
S10 to S26: step
f: focal length
r: radius
θ, θ1, θ2: ray angle

What is claimed is:

1. An imaging device comprising:

an image sensor that includes a first pixel and a second pixel having incidence angle characteristics different from incidence angle characteristics of the first pixel;

a mount part to and from an interchangeable lens is attachable and detachable;

a pixel information acquisition section that acquires an output of the first pixel of the image sensor on which subject light is incident through the interchangeable lens mounted on the mount part, and an output of the second pixel, at a plurality of image heights;

a storager that stores a ratio between the output of the first pixel and the output of the second pixel, the ratio at each image height, for each information related to a ray angle with respect to the image sensor in a case where the subject light is incident on the image sensor through the interchangeable lens;

an arithmetic operator that calculates a ratio between the output of the first pixel and the output of the second pixel acquired by the pixel information acquisition section, at each of the plurality of the image heights, to acquire a ratio at each image height; and an information acquisition section that acquires from the storager, information related to a ray angle with respect to the image sensor in a case where the subject light is incident on the image sensor through the interchangeable lens on the basis of the ratio at each image height calculated by the arithmetic operator, wherein the information related to the ray angle with respect to the image sensor is a stop value of the interchangeable lens or a numerical aperture of the interchangeable lens.

2. The imaging device according to claim 1, wherein the image sensor includes a first phase difference pixel and a second phase difference pixel that selectively receive pieces of the subject light passing through different areas of the interchangeable lens by pupil division, and the first pixel is the first phase difference pixel and the second pixel is the second phase difference pixel.

3. The imaging device according to claim 2, further comprising:

a phase shift distance-detection section that detects a phase shift distance on the basis of the outputs of the first and second phase difference pixels of the image sensor;

a defocus distance-calculation section that calculates a defocus distance on the basis of the information related to a ray angle with respect to the image sensor and the phase shift distance; and a focus adjustment unit that moves the image sensor on the basis of the calculated defocus di stance.

4. The imaging device according to claim 1, wherein the image sensor includes a first phase difference pixel and a second phase difference pixel that selectively receive pieces of the subject light passing through different areas of the interchangeable lens by pupil division, and normal pixels that receive the pieces of the subject light, respectively, and the first pixel is the first phase difference pixel or the second phase difference pixel, and the second pixel is the normal pixel.

5. The imaging device according to claim 1, the storager stores the ratio between the output of the first pixel and the output of the second pixel for each stop value of the interchangeable lens or each numerical aperture of the interchangeable lens, and the information acquisition section reads a stop value or a numerical aperture corresponding to the ratio from the storager on the basis of the ratio calculated by the arithmetic operator, and acquires the read stop value or the read numerical aperture as the current stop value or the current numerical aperture of the interchangeable lens.

6. The imaging device according to claim 1, wherein the storager stores first tables showing the ratio between the output of the first pixel and the output of the second pixel at every image height, for every stop value of the interchangeable lens or every numerical aperture of the interchangeable lens, the pixel information acquisition section acquires outputs of the first pixels and outputs of the second pixels at a plurality of image heights on the image sensor, the arithmetic operator calculates ratios between the acquired outputs of the first pixels and the acquired outputs of the second pixels at the plurality of image heights, and acquires a second table showing the ratio at each image height, and the information acquisition section reads a stop value or a numerical aperture corresponding to a first table, which coincides with or is closest to the second table, from the storager on the basis of the acquired second table, and acquires the read stop value or the read numerical aperture as the current stop value or the current numerical aperture of the interchangeable lens.

7. The imaging device according to claim 6, wherein the arithmetic operator calculates a ratio between the output of the unsaturated first pixel and the output of the unsaturated second pixel among the acquired first pixels and the acquired second pixels at the plurality of image heights, and acquires the second table that shows the ratio at each image height.

8. The imaging device according to claim 1, further comprising:

a contrast detection section that detects contrast of a subject, wherein the arithmetic operator increases the numbers of the first and second pixels, which are used for the calculation of the ratio, according to the contrast of the subject detected by the contrast detection section as the contrast of the subject is higher.

9. The imaging device according to claim 1, further comprising:

a communication unit that communicates with the interchangeable lens; and a control unit that causes the pixel information acquisition section, the arithmetic operator, and the information acquisition section to operate in a case where the stop value or the numerical aperture of the interchangeable lens is not capable of being acquired from the mounted interchangeable lens through the communication unit.

10. The imaging device according to claim 9, further comprising:

a photometric unit that calculates brightness of a subject using a stop value or a numerical aperture of the interchangeable lens acquired through the communication unit or a stop value or a numerical aperture of the interchangeable lens acquired by the information acquisition section.

11. The imaging device according to claim 1, further comprising:

a mode setting section that sets an information acquisition mode, wherein the pixel information acquisition section, the arithmetic operator, and the information acquisition section operate in a case where an imaging instruction is input from an imaging instruction unit in a state where the information acquisition mode is set by the mode setting section.

12. The imaging device according to claim 1, further comprising:

an image acquisition unit that acquires image data through the image sensor in a case where an imaging instruction is input from an imaging instruction unit; and a recording unit that creates an image file storing the acquired image data and records the image file in a recording medium, wherein the recording unit records the information related to a ray angle with respect to the image sensor, which is acquired by the information acquisition section, in a header of the image file.

13. An information acquisition method for an imaging device comprising: an image sensor that includes a first pixel provided thereon and a second pixel provided thereon and having incidence angle characteristics different from incidence angle characteristics of the first pixel, the image sensor on which subject light is incident through the interchangeable lens mounted on the imaging device; and a storager that stores a ratio between the output of the first pixel and the output of the second pixel, the ratio at each image height, for each information related to a ray angle with respect to the image sensor in a case where the subject light is incident on the image sensor through the interchangeable lens, the information acquisition method comprising:

a pixel information-acquisition step of acquiring an output of the first pixel of the image sensor on which subject light is incident through an interchangeable lens mounted on the imaging device, and an output of the second pixel, at a plurality of image heights;

an arithmetic operation step of calculating a ratio between the acquired output of the first pixel and the acquired output of the second pixel, at each of the plurality of the image heights, to acquire a ratio at each image height; and an information-acquisition step of acquiring from the storager, information related to a ray angle with respect to the image sensor in a case where the subject light is incident on the image sensor through the interchangeable lens on the basis of the calculated ratio at each image height, wherein the information related to the ray angle with respect to the image sensor is a stop value of the interchangeable lens or a numerical aperture of the interchangeable lens.

14. The information acquisition method according to claim 13, wherein the storager store the ratio between the output of the first pixel and the output of the second pixel, for each stop value of the interchangeable lens or each numerical aperture of the interchangeable lens, and in the information-acquisition step, a stop value or a numerical aperture corresponding to the ratio is read from the storager on the basis of the calculated ratio, and the read stop value or the read numerical aperture is acquired as the current stop value or the current numerical aperture of the interchangeable lens.

15. The information acquisition method according to claim 13, wherein the imaging device comprises a storager in which first tables showing the ratio between the output of the first pixel and the output of the second pixel at every image height are stored for every stop value of the interchangeable lens or every numerical aperture of the interchangeable lens, outputs of the first pixels and outputs of the second pixels at a plurality of image heights on the image sensor are acquired in the pixel information-acquisition step, ratios between the acquired outputs of the first pixels and the acquired outputs of the second pixels at the plurality of image heights are calculated and a second table showing the ratio at each image height is acquired in the arithmetic operation step, a stop value or a numerical aperture corresponding to a first table, which coincides with or is closest to the second table, is read from the storager on the basis of the acquired second table, and the read stop value or the read numerical aperture is acquired as the current stop value or the current numerical aperture of the interchangeable lens in the information-acquisition step.

16. The information acquisition method according to claim 13, wherein the imaging device comprises a communication unit that communicates with the interchangeable lens, the method comprises a step of acquiring a stop value or a numerical aperture of the interchangeable lens from the mounted interchangeable lens through the communication unit, and processing of the pixel information-acquisition step, the arithmetic operation step, and the information-acquisition step is performed to acquire the current stop value or the current numerical aperture of the interchangeable lens in a case where the stop value or the numerical aperture of the interchangeable lens is not capable of being acquired through the communication unit.

17. A non-transitory computer-readable recording medium causing a computer to implement an information acquisition function of an imaging device in a case where a command stored in the recording medium is read by the computer, the imaging device comprising: an image sensor that includes a first pixel provided thereon and a second pixel provided thereon and having incidence angle characteristics different from incidence angle characteristics of the first pixel, the image sensor on which subject light is incident through the interchangeable lens mounted on the imaging device; and a storager that stores a ratio between the output of the first pixel and the output of the second pixel, the ratio at each image height, for each information related to a ray angle with respect to the image sensor in a case where the subject light is incident on the image sensor through the interchangeable lens, the information acquisition function comprising:

a function of acquiring an output of the first pixel of the image sensor, on which subject light is incident through an interchangeable lens mounted on the imaging device, and an output of the second pixel, at a plurality of image heights;

a function of calculating a ratio between the acquired output of the first pixel and the acquired output of the second pixel, at each of the plurality of the image heights, to acquire a ratio at each image height; an a function of acquiring from the storager, information related to a ray angle with respect to the image sensor in a case where the subject light is incident on the image sensor through the interchangeable lens on the basis of the calculated ratio at each image height, wherein the information related to the ray angle with respect to the image sensor is a stop value of the interchangeable lens or a numerical aperture of the interchangeable lens.

* * * * *